(12) United States Patent
Chegini et al.

(10) Patent No.: US 9,792,024 B2
(45) Date of Patent: Oct. 17, 2017

(54) SYSTEMS AND METHODS FOR MANAGEMENT AND PROCESSING OF ELECTRONIC DOCUMENTS USING VIDEO ANNOTATIONS

(71) Applicant: E-PLAN, INC., Los Angeles, CA (US)

(72) Inventors: Michael M. Chegini, Newport Coast, CA (US); Stacy Ann Reno, Orange, CA (US); Leon Kotovich, Irvine, CA (US)

(73) Assignee: E-PLAN, INC., Irvine, CA (US)

( * ) Notice: Subject to any disclaimer, the term of this patent is extended or adjusted under 35 U.S.C. 154(b) by 0 days.

(21) Appl. No.: 14/828,361

(22) Filed: Aug. 17, 2015

(65) Prior Publication Data

US 2017/0052680 A1 Feb. 23, 2017

(51) Int. Cl.
| | |
|---|---|
| *G06F 17/00* | (2006.01) |
| *G06F 3/0484* | (2013.01) |
| *G06F 17/30* | (2006.01) |
| *G06Q 10/06* | (2012.01) |
| *G06Q 50/08* | (2012.01) |

(Continued)

(52) U.S. Cl.
CPC .... *G06F 3/04845* (2013.01); *G06F 17/30825* (2013.01); *G06F 17/30828* (2013.01); *G06F 17/50* (2013.01); *G06Q 10/06* (2013.01); *G06Q 50/08* (2013.01); *G11B 27/00* (2013.01)

(58) Field of Classification Search
CPC ............ G06F 3/04845; G06F 3/04842; G06F 3/0486; G06F 17/241; G06F 17/30825; G06F 17/30828
See application file for complete search history.

(56) References Cited

U.S. PATENT DOCUMENTS

| | | |
|---|---|---|
| 5,444,843 A | 8/1995 | Nilsson et al. |
| 5,524,202 A | 6/1996 | Yokohama |

(Continued)

OTHER PUBLICATIONS

Nitro PDF Professional 6 User Guide, © 2010 Nitro PDF Software, published Oct. 14, 2010; 127 pp.

(Continued)

*Primary Examiner* — Scott Baderman
*Assistant Examiner* — Matthew G McVicker
(74) *Attorney, Agent, or Firm* — Knobbe, Martens, Olson & Bear LLP

(57) ABSTRACT

Systems and methods for managing and processing building plan documents including plan sheets. A toolbox of building project-related annotation tools comprising geometrical shapes and corresponding metadata indicating a criticality of a building project related defect is provided. An interface enables a selection of one or more video frames from a video file. A video frame editing area enables a user to drag and drop a shape over a portion of a frame displayed in the editing area to highlight a building defect. An interface enables the user to define a relationship between a video file and a building-related task. A user annotation, comprising a geometrical shape and corresponding metadata indicating a criticality of a building project related defect, of a video frame is received. An association of the video file with a first building project-related task is generated. A search interface enables the user to search for annotated video files associated with building projects.

27 Claims, 25 Drawing Sheets

(51) Int. Cl.
  *G06F 17/50* (2006.01)
  *G11B 27/00* (2006.01)

(56) References Cited

U.S. PATENT DOCUMENTS

| | | | |
|---|---|---|---|
| 5,860,074 | A | 1/1999 | Rowe |
| 5,918,219 | A | 6/1999 | Isherwood |
| 5,950,206 | A | 9/1999 | Krause |
| 6,092,050 | A | 7/2000 | Lungren et al. |
| 6,198,833 | B1 * | 3/2001 | Rangan .................... G06K 9/32 382/103 |
| 6,581,040 | B1 | 6/2003 | Wright et al. |
| 6,922,701 | B1 | 7/2005 | Ananian |
| 7,042,468 | B2 | 5/2006 | Schwegler |
| 7,062,514 | B2 | 6/2006 | Harris |
| 7,174,339 | B1 | 2/2007 | Wucherer |
| 7,257,771 | B2 | 8/2007 | Buser |
| 7,283,975 | B2 | 10/2007 | Broughton |
| 7,600,193 | B2 | 10/2009 | Gunderson |
| 7,600,198 | B2 | 10/2009 | Gunderson et al. |
| 7,907,794 | B2 | 3/2011 | Hartmann et al. |
| 7,958,185 | B2 | 6/2011 | Rothermel |
| 7,971,149 | B2 | 6/2011 | Hartmann |
| 7,975,222 | B1 | 7/2011 | Chegini et al. |
| 8,244,036 | B2 | 8/2012 | Hartmann et al. |
| 8,712,893 | B1 * | 4/2014 | Brandmaier ........ G06F 17/3028 705/35 |
| 9,135,602 | B2 | 9/2015 | Chegini |
| 2001/0047251 | A1 | 11/2001 | Kemp |
| 2002/0013933 | A1 | 1/2002 | Shiba |
| 2002/0035451 | A1 | 3/2002 | Rothermel |
| 2002/0198755 | A1 | 12/2002 | Birkner |
| 2003/0052877 | A1 | 3/2003 | Schwegler |
| 2003/0101127 | A1 | 5/2003 | Cornelius |
| 2003/0234725 | A1 * | 12/2003 | Lemelson .............. G08B 7/066 340/521 |
| 2004/0024623 | A1 | 2/2004 | Ciscon |
| 2004/0117361 | A1 | 6/2004 | Greer et al. |
| 2004/0215633 | A1 | 10/2004 | Harris |
| 2004/0225968 | A1 * | 11/2004 | Look ..................... G06F 3/0481 715/778 |
| 2005/0268228 | A1 | 12/2005 | Buser |
| 2006/0085322 | A1 | 4/2006 | Crookshanks |
| 2006/0085747 | A1 | 4/2006 | Morgan |
| 2006/0098941 | A1 * | 5/2006 | Abe ..................... G11B 27/031 386/279 |
| 2006/0107203 | A1 | 5/2006 | Schilling et al. |
| 2007/0055926 | A1 | 3/2007 | Christiansen et al. |
| 2007/0061774 | A1 | 3/2007 | Chan |
| 2007/0112860 | A1 | 5/2007 | Ostanik |
| 2007/0118795 | A1 | 5/2007 | Noyes et al. |
| 2007/0118817 | A1 | 5/2007 | Gunderson |
| 2007/0219645 | A1 * | 9/2007 | Thomas ................ G05B 15/02 700/29 |
| 2007/0226606 | A1 | 9/2007 | Noyes et al. |
| 2008/0062167 | A1 * | 3/2008 | Boggs ................ G06F 17/5004 345/419 |
| 2008/0175515 | A1 | 7/2008 | Hartmann et al. |
| 2009/0187853 | A1 | 7/2009 | Noyes |
| 2009/0210818 | A1 | 8/2009 | Hartmann |
| 2009/0228399 | A1 | 9/2009 | Connors et al. |
| 2009/0254853 | A1 | 10/2009 | Jacob |
| 2009/0327856 | A1 * | 12/2009 | Mouilleseaux ...... G11B 27/034 715/230 |
| 2011/0078169 | A1 | 3/2011 | Sit |
| 2011/0145691 | A1 | 6/2011 | Noyes |
| 2011/0145692 | A1 | 6/2011 | Noyes et al. |
| 2011/0176179 | A1 * | 7/2011 | Judelson ................ G06T 19/00 358/448 |
| 2011/0270584 | A1 * | 11/2011 | Plocher ............... G06F 17/5004 703/1 |
| 2011/0276927 | A1 | 11/2011 | Chegini et al. |
| 2011/0302506 | A1 | 12/2011 | Noyes et al. |
| 2012/0050332 | A1 | 3/2012 | Nikara et al. |
| 2012/0195508 | A1 | 8/2012 | Noyes |
| 2012/0299944 | A1 | 11/2012 | Hartmann et al. |
| 2013/0141460 | A1 * | 6/2013 | Kane-Esrig .......... H04M 3/5116 345/633 |
| 2013/0249906 | A1 | 9/2013 | Gunderson et al. |
| 2014/0033069 | A1 * | 1/2014 | Chegini ................ G06Q 50/08 715/751 |
| 2014/0281860 | A1 | 9/2014 | Chegini |
| 2015/0067562 | A1 * | 3/2015 | Sasaki ................ G06F 3/04817 715/769 |

OTHER PUBLICATIONS

Nitro Pro 7 User Guide, © Nitro, published Jul. 13, 2012; 156 pp.
Results of www.google.com/patents by Applicant Mar. 16, 2007.
U.S. Appl. No. 14/842,598, filed Sep. 1, 2015, Chegini.

* cited by examiner

| Maintenance List | Purpose | Optional |
|---|---|---|
| Category | Manage, group and sort plan reviewer's comments/corrections and standard comments. May be used on the Correction List generated by the system. | Yes |
| Code Table | Code tables used within the agency: IRC, CBC, etc. May be used on Permits and Corrections Lists. | Yes |
| Comment Type | Indicates whether a comment is from an initial review or a back check process | Yes |
| Construction Type | Industry codes as published in a standard or quasi standard (e.g., CBC 2010) | Yes |
| Contact Method | Applicant/Owner's preferred method of contact (email, phone, etc.). May be used during the Notification process to deliver files back to the Applicant(s) | Yes |
| Contact Role | Client's specific terminology for categorizing Contacts (Owner, Designer, etc.) | Yes |
| Department | Maintain each agency's department names and department codes.<br><br>Users are assigned to a department.<br><br>Plans are assigned to a department. | Yes |
| Dimensions | Agency's list of *acceptable* paper sizes of incoming drawings. | Yes |
| Discipline | Agency's list of industry standard disciplines. Sort order determines how Correction list records are grouped. . May be used on the Corrections List generated by the system. | Yes |
| Direction | Maintain Street directional values: N, E, NW, etc. on address related data. | Yes |
| Disposition | Disposition of a comment (open/closed) placed by a plan reviewer. | Yes |

*FIG. 6A*

| Maintenance List | Purpose | Obtainable |
|---|---|---|
| Document Type | Value assigned to each incoming file and attachment received during Intake whether for Plans, Calcs, Reports, Permit Application, etc. | Yes |
| Impact | Defines significance of Plan Reviewers corrections (i.e. Major, Minor, etc.), based on his agencies own governing rules. May be used to communicate with the Applicant, and in applicable charts and graphs. | Yes |
| Occupancy Codes | Industry codes as published in a standard or quasi standard (e.g., CBC 2010). | Yes |

| Maintenance List | Purpose | Obtainable |
|---|---|---|
| Permit Priority | Agency specific terminology regarding the expected turn around, priority of permits (i.e. Overnight, High, Normal, etc.) Primarily used in charts, graphs. | Yes |
| Permit Type | Agency specific permit terminology: Roof, Pool, Electrical, etc. | Yes |
| Project Type | Agency specific project terminology: Residential, Commercial, Zoning, etc. | Yes |
| Street Type | Maintain commonly used street type designations: Avenue, Boulevard, Street, etc. | Yes |
| Sub-Category | Agency list of values and sort order of comments that will be used on the Corrections lists | Yes |
| Submittal | Agency specific permit terminology re: submittal language: (i.e. 1$^{st}$ or First, 2$^{nd}$ or Second, 3 or Three, etc.) | Yes |

Containing (select one):
- the exact phrase, i.e. "fire walls"
- all the keywords, i.e. fire AND walls
- any keywords, i.e. fire OR walls Chklist Items

| Drawing Sheet | Version Opened | Version Closed | x | y | | | |
|---|---|---|---|---|---|---|---|
| A-2 | 20110826A | Not Closed | -46 | 59 | Remove | Edit | Review |
| | 20110825A | Not Closed | | | Remove | Edit | |

Add Drawing

*FIG. 17*

List Items

| | List Types | Discipline ▼ | |
|---|---|---|---|
| PK | Label | Value | Order |
| 248 | Residential Initial | RE INIT | 1 |
| 249 | Commercial Initial | CO INIT | 1 |
| 250 | Architectural | ARCH | 3 |
| 251 | Mechanical | MECH | 4 |
| 252 | Structural | STRUCT | 5 |
| 253 | Electrical | ELEC | 6 |
| 254 | Plumbing | PLMB | 7 |
| 255 | Fire Safety | FIRE | 8 |
| 256 | Disabled Access | ACCESS | 9 |
| 257 | Green | GREEN | 10 |

*FIG. 19*

List Items

List Types: [Category ▼]

Used to manage and group plan reviewer's comments

| PK | Label |
|---|---|
| 91 | PART I: GENERAL REQUIREMENTS |
| 225 | PART II: ZONING |
| 258 | PART III: BUILDING CODE REQUIREMENTS |

| Value | Order |
|---|---|
| PART I: GENERAL REQUIREMENTS | 1 |
| PART II: ZONING | 2 |
| PART III: BUILDING CODE REQUIREMENTS | 3 |

*FIG. 20*

List Items

List Types: Sub-category ▼

Sub-categories to help describe the main categories

| PK | Label | Value | Order |
|---|---|---|---|
| 276 | A. PERMIT APPLICATION | A. PERMIT APPLICATION | 1 |
| 261 | B. CLEARANCES | B. CLEARANCES | 2 |
| 262 | C. ADMINISTRATION | C. ADMINISTRATION | 3 |
| 263 | A. GENERAL REQUIREMENTS | A. GENERAL REQUIREMENTS | 4 |
| 264 | B. OCCUPANCY CLASSIFICATION | B. OCCUPANCY CLASSIFICATION | 5 |
| 265 | C. BUILDING HEIGHT LIMITATION | C. BUILDING HEIGHT LIMITATION | 6 |
| 267 | D. FIRE-RESISTANACE RATED CONSTRUCTION | D. FIRE-RESISTANACE RATED CONSTRUCTION | 8 |
| 268 | F. FIRE PROTECTION | F. FIRE PROTECTION | 9 |
| 269 | G. MEANS OF EGRESS | G. MEANS OF EGRESS | 10 |
| 271 | H. INTERIOR ENVIRONMENT | H. INTERIOR ENVIRONMENT | 12 |
| 272 | I. BUILDING ENVELOPE | I. BUILDING ENVELOPE | 13 |

*FIG. 21*

SYSTEMS AND METHODS FOR MANAGEMENT AND PROCESSING OF ELECTRONIC DOCUMENTS USING VIDEO ANNOTATIONS

BACKGROUND OF THE INVENTION

Incorporation by Reference to any Priority Applications

Any and all applications for which a foreign or domestic priority claim is identified in the Application Data Sheet as filed with the present application are hereby incorporated by reference under 37 CFR 1.57.

Field of the Invention

The present invention is related to electronic/digital construction-related plans, and in particular, to methods and systems of managing electronic construction-related plans.

Description of the Related Art

Conventionally, constructions documents are either hardcopy blueprint type drawings or relatively simple electronic drawings which provide a limited ability to associate or store data in association with such hardcopy or simple electronic drawings. Hence, conventional systems lack an adequate capability for the various entities involved in the production, approval and implementation of a construction project (e.g., architects, design firms, contractors, and public agencies, such as city plan approval agencies), to modify or comment on such plans. Further, conventional systems lack an adequate capability to locate and generate reports with respect to plan comments.

SUMMARY OF THE INVENTION

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Systems and methods are described for managing and displaying design related documents. For example, certain systems and methods may be used for managing building-design related documents, manufacturing documents, clothing design documents, or other types of design documents. Certain embodiments enable a user to search, filter, and report on comments added to such documents. Certain embodiments pre-render documents at different magnifications and in different colors for faster presentation to a user.

An example embodiment provides a system for managing documents, such as building plan documents or other types of design documents, comprising: one or more computing devices; non-transitory computer readable memory storing program code that when executed by the one or more computing devices is configured to cause the system to perform operations comprising: receiving an electronic building plan document including a plurality of plan sheets; providing a first of the plurality of plan sheets for display; providing a user interface via which a user can select or enter a first comment; providing a user interface via which the user can associate at least one of the following first plurality of metadata with the first comment: a category; a subcategory; a project type or discipline; storing a first plurality of comments in association with respective metadata; providing for display a comments list in association with the first plan sheet, the comments list including a second plurality of comments; at least partly in response to the user selecting a second comment with a specified plan sheet coordinate in the comments lists, providing the second comment for display over the first plan sheet at the plan sheet coordinate and causing the portion of the first plan sheet corresponding to the specified plan sheet to be substantially centered in a first area; enabling the user to search for comments by specifying, via a search user interface, one or more items of the first plurality of metadata; providing a user interface via which the user can select a plurality of comments to be included in a plan correction list; generating a correction list including a plurality of comments specified by a plurality of users.

Another example embodiment provides a system for managing documents, such as building plan documents or other types of design documents, comprising: one or more computing devices; and non-transitory computer readable memory storing program code that when executed by the one or more computing devices is configured to cause the system to perform operations comprising: receiving an electronic building plan document including a plurality of plan sheets; providing a first of the plurality of plan sheets for display; providing a user interface via which a user can select or enter a first comment associated with the first plan sheet; providing a user interface via which the user can associate metadata, including at least a project type or discipline, with the first comment: storing a first plurality of comments, including at least the first comment, in association with respective metadata; providing a user interface via which the user can select, by category and/or subcategory a plurality of comments to be included in a plan correction list; generating a correction list including a plurality of comments specified by a plurality of users.

An example embodiment provides a non-transitory computer readable media storing program code that when executed by the one or more computing devices is configured to cause the system to perform operations comprising: receiving an electronic document including a plurality of plan sheets; providing a first of the plurality of plan sheets for display; providing a user interface via which a user can select or enter a first comment associated with the first plan sheet; providing a user interface via which the user can associate metadata, including at least a project type or discipline, with the first comment: storing a first plurality of comments, including at least the first comment, in association with respective metadata; providing a user interface via which the user can select, by category and/or subcategory a plurality of comments to be included in a plan correction document; and generating a correction document including a plurality of comments specified by a plurality of users.

Another example embodiment provides a method comprising: receiving an electronic document, such as building plan document or other type of design document, including a plurality of plan sheets; providing a first of the plurality of plan sheets for display; providing a user interface via which a user can select or enter a first comment associated with the first plan sheet; providing a user interface via which the user can associate metadata, including at least a project type or discipline, with the first comment: storing a first plurality of comments, including at least the first comment, in association with respective metadata; providing a user interface via which the user can select, by category and/or subcategory a plurality of comments to be included in a plan correction document; and generating a correction document including a plurality of comments specified by a plurality of users.

An aspect of the disclosure is a system for managing building plan documents, comprising: one or more computing devices; and non-transitory computer readable memory storing program code that when executed by the one or more computing devices is configured to cause the system to perform operations comprising: receiving an electronic building plan document including a plurality of plan sheets; providing a first of the plurality of plan sheets for display; providing a user interface via which a user can select or enter a first comment associated with the first plan sheet; providing a user interface via which the user can associate metadata, including at least a project type or discipline, with the first comment: storing a first plurality of comments, including at least the first comment, in association with respective metadata; providing a user interface enabling a user to upload a video file, image file, audio file; providing a user interface comprising: a toolbox of building project-related annotation tools, the building project-related annotation tools comprising geometrical shapes and corresponding metadata indicating a criticality of a building project related defect, wherein at least one geometrical shape comprises a perimeter configured to indicate a first criticality level; an interface enabling a user to select one or more video frames from an uploaded video file; an editing area configured to display at least one user selected frame and enabling the user to drag and drop a geometric shape over a portion of a frame displayed in the editing area and to size the geographic shape; an association interface enabling the user to define a relationship between a video file, a building project, and a building-related task; receiving a user annotation of at least one video frame, the user annotation comprising a geometrical shape selected by the user from the toolbox and corresponding metadata indicating a criticality of a building project related defect; receiving an association of the video file with a first building project-related task; storing the user annotation of the at least one video frame, the user annotation comprising the geometrical shape selected by the user from the toolbox and corresponding metadata indicating the criticality of the building project related defect; storing the association of the video file with the first building project and the first building project-related task; providing a search interface enabling the user to search for building project-related annotated video files; receiving a first user search query via the search interface enabling the user to search for building project-related annotated video files; identifying, based at least in part on a comparison of the first search query with video file metadata, at least one building project-related annotated video file; and providing search results comprising the at least one identified building project-related annotated video file.

An aspect of the disclosure is a system for managing building plan documents, comprising: one or more computing devices; and non-transitory computer readable memory storing program code that when executed by the one or more computing devices is configured to cause the system to perform operations comprising: receiving an electronic building plan document including a plurality of plan sheets; providing a user interface enabling a user to upload a video file; providing a user interface comprising: a toolbox of building project-related annotation tools, the building project-related annotation tools comprising geometrical shapes and corresponding metadata indicating a criticality of a building project related defect, wherein at least one geometrical shape comprises a perimeter configured to indicate a first criticality level; an interface enabling a user to select one or more video frames from an uploaded video file; an editing area configured to display at least one user selected frame and enabling the user to drag and drop a geometric shape over a portion of a frame displayed in the editing area and to size the geographic shape; an association interface enabling the user to define a relationship between a video file and the building plan document; receiving a user annotation of at least one video frame, the user annotation comprising a geometrical shape selected by the user from the toolbox and corresponding metadata indicating a criticality of a building project related defect; receiving an association of the video file with a first building project-related task; storing the user annotation of the at least one video frame, the user annotation comprising the geometrical shape selected by the user from the toolbox and corresponding metadata indicating the criticality of the building project related defect; storing the association of the video file with the first building project and the first building project-related task; providing a search interface enabling the user to search for building project-related annotated video files; receiving a first user search query via the search interface enabling the user to search for building project-related annotated video files; identifying, based at least in part on a comparison of the first search query with video file metadata, at least one building project-related annotated video file; and providing search results comprising the at least one identified building project-related annotated video file.

An aspect of the disclosure is non-transitory computer readable memory storing program code that when executed by one or more computing devices is configured to cause the one or more computing devices to perform operations comprising: receiving an electronic building plan document including a plurality of plan sheets; providing a user interface enabling a user to upload a video file; providing a user interface comprising: building project-related annotation tools, the building project-related annotation tools comprising geometrical shapes and corresponding metadata indicating a criticality of a building project related defect, wherein at least one geometrical shape comprises a perimeter configured to indicate a first criticality level; an interface enabling a user to select one or more video frames from an uploaded video file; an editing area configured to display at least one user selected frame and enabling the user to drag and drop a geometric shape over a portion of a frame displayed in the editing area and to size the geographic shape; an association interface enabling the user to define a relationship between a video file and the building plan document; receiving a user annotation of at least one video frame, the user annotation comprising a geometrical shape selected by the user from the building project-related annotation tools and corresponding metadata indicating a criticality of a building project related defect; receiving an association of the video file with a first building project-related task; storing the user annotation of the at least one video frame, the user annotation comprising the geometrical shape selected by the user from the building project-related annotation tools and corresponding metadata indicating the criticality of the building project related defect; storing the association of the video file with the first building project and the first building project-related task; providing a search interface enabling the user to search for building project-related annotated video files; receiving a first user search query via the search interface enabling the user to search for building project-related annotated video files; identifying, based at least in part on a comparison of the first search query with video file metadata, at least one building project-related annotated video file; and providing search results comprising the at least one identified building project-related annotated video file.

BRIEF DESCRIPTION OF THE DRAWINGS

The disclosed aspects will hereinafter be described in conjunction with the appended drawings, provided to illustrate and not to limit the disclosed aspects, wherein like designations denote the elements.

FIGS. 2-5, 6A, 6B, 7-8, 9A, 9B, 10-23 illustrate example user interfaces.

DETAILED DESCRIPTION OF PREFERRED EMBODIMENTS

Systems and methods are described for managing design related documents. For example, certain systems and methods may be used for managing building-design related documents, such as electronic construction documents, fix-it documents from plan checkers, etc., manufacturing documents, clothing design documents, or other types of design documents.

Certain embodiments enable a user to search, filter, and report on comments added to a document, such as an electronic building related document, a manufacturing document, a clothing design document, or other design document (e.g., a document in portable document format (PDF) form, ISO 32000 compliant documents, XPF documents, etc.), such as comments by plan checkers added to a building plan submitted by an applicant to a government agency for approval or other design document needing approval. Certain embodiments further provide event driven notifications to one or more groups involved in the design and approval process. Certain embodiments further provide workflow process management and role based security.

Example embodiments will now be described with respect to the figures.

Figure 1:
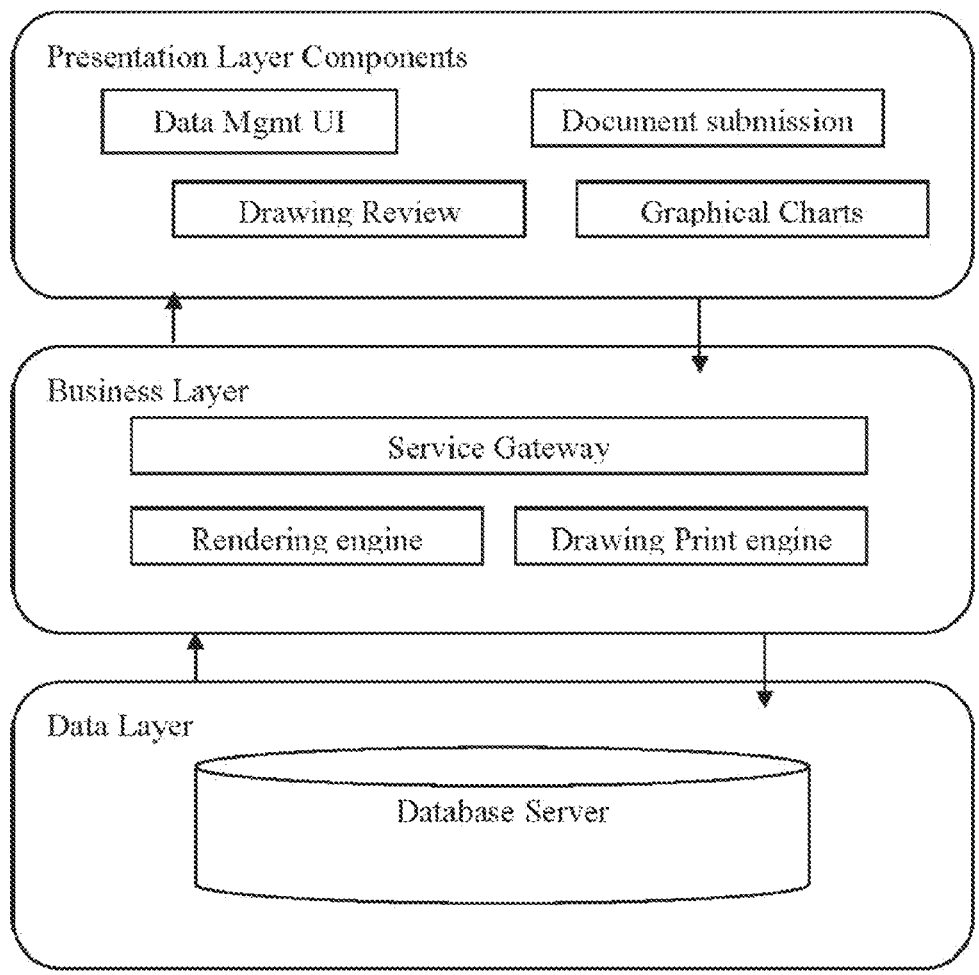
FIG. 1 illustrates an example system architecture.

FIG. 1 illustrates an example architecture of a plan management system. It is understood that other architectures may be used with fewer, additional, and/or different components. The plan management system may include geographically distributed components and/or co-located components (e.g., servers, data stores, user terminals, etc.). The system may interact and communicate with systems of end users, such as terminals (e.g., general purposes computer systems, servers, tablet computers, smart phones, etc.) of plan checkers, project managers, architects, designers, etc. For example, the plan management system may include a network interface that communicates with user terminals over a network, such as the Internet, a local network, or otherwise. The user terminals may include displays, input devices (e.g., keyboards, mice, trackballs, touch screens, microphones, etc.), speakers, printers, etc. The user terminals may host or have access to browsers or other interfaces configured to access resources, such as documents formatted using HTML or other formatting languages.

Referring to FIG. 1, an example architecture of the system includes a data layer, a business layer, and a presentation layer. The data layer may include a database in the form of an SQL (structured query language) database or other data store type, and may store project/design drawings and associated documents (e.g., video media, audio media, still image media, word processing documents, etc.) and metadata. The database may store drawing revision histories (e.g., including date of revisions, who made the revisions, what was revised, etc.), drawings in an originally submitted formats and/or in a converted formats. Optionally, a directory structure for cached files may be organized using drawing records' primary keys. The database may store standard comment libraries, user account information, user permissions, etc.

The business layer may include a rendering engine, a drawing printing component, and a service gateway. The rendering engine is used to render drawings and may be a multi-process, multi-threaded rendering engine. For example, the rendering engine may invoke libraries (e.g., Java libraries) for converting a master tile (e.g., a PNG master tile, wherein a given drawing may include one or more tiles or may be divided into two more tiles) into differently formatted tiles for consumption by a drawing review system. By way of further example, the rendering engine may read a PDF drawing file and convert it to a master tile. The drawing printing component may be configured to generate printable files in a PDF or other desired format. The service gateway may be used to expose an API (application programming interface) that may be invoked by routines executed in a user's browser. By way of example and not limitation, the API may respond with data objects, such as JSON (JavaScript Object Notation) or XML (eXtended Markup Language) data objects, as appropriate.

The presentation layer may include data management interfaces, a document submission component, a drawing/document review component, a graphical charting component, and a document annotation component. The data management interfaces are configured to receive data (e.g., from user or API interfaces) and post data. For example, the interface may employ AJAX-based interactions with HTTP posts to the system and JSON requests back. The document submission component may be used to receive documents from users. For example, the document submission component may be configured to provide an external interface to routines executed by a user browser. The document submission component may be configured to provide the user browser with metadata regarding the submission and may enable multi-file submission by the user without requiring browser page refreshing. The drawing review component may be configured to input multiple tile layers from the rendering engine, and then generate one or more additional layers (e.g., multiple SVG (scalable vector graphics) canvases) to provide vector shapes, measurement tools, commenting, and other drawing review functionality. The graphical charting component may provide the user with interactive charts, as described elsewhere herein. Optionally, the graphical charting component may be configured to use a programming/scripting language to generate dynamic SVG canvases from JSON data fetched from the data layer.

In response to a user request, the system may queue a drawing to be rendered. When queuing the drawing, the system may write a configuration file (e.g., an INI file) that includes rendering instructions to a file system. The file system may date stamp the configuration file and/or the drawing, and may optionally act as a first-in-first-out queue with respect to queued drawings. The multi-process, multi-threaded rendering engine may access the configuration file corresponding to a drawing to be rendered. A given process may render a given drawing (e.g., a single drawing), and optionally each thread performs a separate zoom level and/or color version rendering of the drawing.

An example rendering process will now be described. Drawings are pulled from the drawing queue (e.g., one at a time), and then routed through a queue for a thread pool. An example thread pool management process enhances the rendering time of a given rendering request. In certain embodiments, the thread pool management process enables a rendering engine to service multiple portals (instances of the plan management application) on a given server, or optionally multiple portals on multiple servers. Thus, a physical server optionally may host multiple instances of the plan management application (portals), wherein a given instance may have a unique set of configurations and customizations. Multiple portals may share physical server resources, such as bandwidth, storage, and/or processing power. However, optionally, there is division of logical and virtual resources, such databases, drawing files, and uploaded user content. Optionally, a given instance of the plan management application is prevented from accessing some or all of the logical and virtual resources of another instance. Portals may also be accessed by a unique locator (e.g., a unique uniform resource locator (URL)) and have a target user-base as part of an organization, such as a business or agency. For example, the 'portal' may be the client's web URL where the plan management application runs. In a virtual machine environment, a single engine could service many 'clients'. The queuing service enables multiple rendering engines to service one server or multiple servers.

An image manipulation service, such as that described below, may optionally be initiated automatically upon system startup, and halted during system shutdown. Optionally, the service operates independently of web applications or other services, but accepts instructions for handling requests.

At state 0, if a drawing has not already been pre-rendered, a virtual printer may be used to convert a drawing from one format to another format (e.g., from a PDF format to a gray-scale PNG Source Tile Image format). In certain embodiments, other renderings are obtained from the source drawing file. Once the source drawing is rendered, it does not need to be re-rendered, as other zoom levels or colors are prepared, optionally at substantially the same time as the source drawing is rendered. Thus, if a user, while later viewing the drawing requests a particular user-selected area of the drawing be displayed with higher magnification ("zoomed"), the system may substantially instantly access and display the previously rendered magnified area, without having to go through the time consuming process of performing the zoom processing and manipulation. Similarly, if a user later requests a selected drawing color, the system may substantially instantly access and display the drawing with the previously rendered selected color, without having to go through the time consuming process of performing the colorizing processing and manipulation. The source drawing may persist in solid state memory during a rendering instance, or it may be loaded into solid state memory from a copy stored on a magnetic or optical disk storage device.

In an example embodiment, the rendering includes dividing the source drawing image into tiles (e.g., 200×200 pixel tiles). In certain embodiments, a typical source drawing image may be between about 2,500 and 16,000 pixels in both the X and Y dimensions, although other pixel quantities and configurations may be used. The origin may be located at or towards the middle of the source drawing, and may be positioned at or towards the middle of a tile. As a result, in certain embodiments the collection of tiles may be an odd number tall and wide, with the same number of tiles left and right, and above and below, the origin. The following illustrates an example tile configuration:

000#000
000#000
X###
000#000
000#000

At state 1, the source drawing image is converted into a colorized source. Optionally, even if the output is black, the source drawing image undergoes colorization. Colorizing may be performed by translating some or all pixels in the drawing image into a target color. For example, white may be converted into an alpha value of 0 (transparent), while solid black (#000000) may be converted to an alpha value of 255 (opaque). Variations of gray may be translated into respective alpha values. Then color(s) may be shifted into a requested spectrum and may be expressed as a RGB (red, green, blue) value or other color model value (e.g., CMYK). Thus, for example, in certain embodiments a given pixel is represented as a 24-bit (4 byte) object in memory, in an ARGB format. In ARGB format, each byte is a number between 0 and 255 (expressed using hexadecimal notation) representing the intensity of the alpha, red, green, and blue colors in the pixel. Given an incoming color request, each pixel's color is translated into the target color.

Color shifting may be performed via pointer walking by adjusting the bit value of each pixel at a very low level in memory. This process provides an extremely efficient color shifting process as it omits layers of abstraction and excess object instantiation by directly transforming the colors with a mathematical algorithm (and optionally, only a mathematical algorithm). Thus, in certain optional embodiments, the color changing is performed without using libraries to abstract out the logic, and instead directly accesses the references in memory to adjust the bits representing the pixel states. The colorized tile may remain in solid state/local memory during the rendering process, and optionally is not persisted to nonvolatile memory, such as a magnetic or optical disk device.

At state 2, for each of a plurality of target zoom levels, the colored source may be resized into a "master tile." The master tile represents an image that is a percentage zoom of the source images, which is padded with tile spacing so that it rounds up to the nearest odd tile count.

Optionally, via a configurable setting, a given master tile may be persisted to disk or other nonvolatile memory. Optionally, by default, a master tile is not persisted to reduce storage consumption. The master tile may remain in memory during the rendering of this specific zoom level, and may be released to garbage collection after this zoom level's thread is complete.

At state 3, the master tile is cut (e.g., virtually divided) into vertical strips (e.g., vertical strips that are one tile wide). This cutting process may be performed using a pointer reference in memory representing a matrix of bits that make up the pixels.

At state 4, a given master tile vertical strip is cut horizontally, thereby preparing the specific tiles for rendering. This cutting process may be performed using a pointer reference in memory representing a matrix of bits that make up the pixels. Optionally, the tile cross section is stored in solid state/local memory during the rendering process, and optionally is not persisted to nonvolatile memory, such as a magnetic or optical disk device.

At state 5, the tiles are optionally stored to a disk device by copying the pixels referenced by a corresponding tile matrix and encoding them (e.g., to PNG format).

At state 6, a cleanup process is performed. After tile persistence to memory, the tile is released. After the last tile is in a strip is persisted, the strip is released. After the last strip in a zoom layer is persisted to memory, the master tile is released. After the last instruction set in a render instance request is complete, the source tile is released. Releasing involves clearing the objects from memory.

At state 7, the rendering request is marked as complete (e.g., by renaming the file to indicate the corresponding is complete, such as "Done-000000x000000"). The file naming convention may be specified by a respective portal. For example, the file name may include a primary key of the drawing (optionally padded by zeros or other number), followed by a primary key of the drawing version. The portal may retrieve the completed files and update the database with the appropriate status.

Optionally, in the event of an error, such as malformed request, improperly formatted input document, or insufficient disk space, the file name may be prefixed with an error indicator (e.g., "Error") and/or an error message/comment may be written into the configuration file, and/or an error notification may be written to an event log.

Drawings may be displayed by stacking a series of layers using a combination of canvases (e.g., HTML5 scalable vector graphics (SVG) canvases). A given layer may indicate drawing additions and/or deletions. In the case of an overlay, two or more drawing layers may be stacked on top of a white canvas. Because the tiles are transparent, a user can see through the layers enabling the user to view additions or deletions between the layers. A control may be provided enabling the user to instruct the system to toggle the layer order, thereby enabling the user to flip between additions or deletions respectively. The user may also instruct the system to change the color of a layer to a specified color.

Sketches or vector paths may be stacked on top of the foregoing layers. A sketch may be in the form of a series of points representing a geometric shape, which may represent a building feature or other feature. The points are stored to the database in a specified format (e.g., a WKT (Well Known Text) format). The sketches/points may be rendered on the drawing using SVG (Scalar Vector Graphics).

Measurements may also be displayed using SVG, but optionally are not persisted to the database. The measurements may include areas calculated from regular or irregular polygons.

A user may instruct the system to print one or more drawings. The system may perform printing in a vector fashion. When a print request for a drawing comes through, either as a single or via a batch, the system opens the source file (which may be in the form of a PDF file), injects print objects, and then feeds the document to the printer in substantially real time.

A given sketch may be written into the source file after the coordinate system is translated. The coordinate translation optionally takes into account for zooms, rotations, and a dynamic document size.

The system optionally is configured to display a document for review in a browser without requiring any plugins to be installed (e.g., without Flash or Adobe Reader).

Certain embodiments of the plan management system enable various stakeholders to add comments to an electronic plan/design document and other project related documents (e.g., video, still image, audio, textual and/or other documents). By way of example, for a building plan, the stakeholders may include various departments in a government plan checking agency or architects, engineers, contractors, consultants, construction project managers, etc., that are involved in reviewing, commenting, and requiring changes to building related plans. The comments may be tied to a specific building feature in a plan drawing or to a specific location on the design drawing. The comments may also apply to the project overall and need not be directly associated to a specific building feature or location. Of course the stakeholders may be different with respect manufacturing documents, design documents, or other document types.

A comments data store, (e.g., with a table structure) is provided that is configured to store, in a searchable form, comments, properties, and metadata associated with a given project or permit application and which may include references to one or more specific plans or plan sheets or other project related documents (e.g., video, still image, audio, textual and/or other documents). For example, a given comment record may include or be linked to some or all of the properties and metadata discussed herein. In addition, a standard comments table may store a library of reusable comments that may be accessed by a user and added to/associated with a project/permit and its specific plan sheets. Users can add terms or properties to a given comment type to facilitate the organization, grouping, and reporting of those comments.

Thus, the comment tables provide users and administrators the ability to search for comments by entering a search string into a search field and/or by selecting properties/metadata from a filter menu. By way of example, a given comment may be associated with metadata including author, date of creation, modification history, modification authors, comment status information, categories, subcategories, project type, discipline, media type (e.g., video, still image, audio, etc.), etc. Optionally, the plan management system and/or an administrator/user may specify which users may assign or associate certain metadata with a comment (e.g., a category, subcategory, discipline, and/or project type).

The system enables a user to conduct searches on comments and other metadata, including the standard comments table and to save a search query or a group of search queries to memory. Users may save their own searches for reuse and may retrieve and modify their searches via a labeled "favorites" control. The user can assign a user-defined label, which may be descriptive as to the subject matter of the saved search queries. Additionally, a user may retrieve and run saved standard comment searches created by other users, however, optionally the system may prevent a user from modifying another user's saved searches.

Drawing or other document comments may be associated with an image tag pasted into the drawing or other document (e.g., with a text label placed on top of the tag corresponding to a comment number or other identifier). Optionally, additional metadata may be associated with the tag (e.g., the full comment that appears when the user hovers a mouse over the image tag).

As noted above, in addition to being able to search for text within comments, comments may be searched on based on one or more comment properties or metadata (or the lack thereof). For example, a user can search for comments in a permit/project which have not been associated with X/Y (latitude/longitude) coordinates on plan reviews.

A given comment or group of comments may be assigned a label or flag indicative as to the subject matter and/or functional use. For example, a given comment or selected group of comments can be labeled as a "checklist" item. The system may display comments in a list format in a panel or window, rather than simply at various locations distributed over a drawing. A 'checklist' item denotes a comment/review which the designator indicates must always be performed by the plan reviewer, based on the business rules in place for the user. For example, checklist item may include a check to make sure that building modifications proposed in a plan do not fall outside a property line. A standard comment may or may not be designated as a 'checklist' item.

In addition, users and administrators can import, create, and maintain one or more libraries of standard comments for reuse, and define groupings of standard comments by department or other organizational group. Optionally, the comments may be edited, stored and displayed in a rich text format, HTML, or other format that encodes text formatting properties, such as bolding, underlining, italicizing, and typefaces, and to provide support for tab characters, carriage returns, and numbered or bulleted lists. Optionally, only certain authorized users, such as administrators, may be permitted to edit or modify standard comment text. Certain embodiments enable comments stored in another document type, such as a spreadsheet or word processing document, to be batch uploaded into the standard comments table for later user access.

In addition, a correction list, such as might be specified by a plan checker or architect, may be automatically grouped/generated and formatted based on a user specification. The correction list may then be provided to the applicant, architect or other end user. After the applicant has corrected the noted items, the applicant may resubmit corrected plans (also referred to as a resubmittal) for plan check and approval. Optionally, this process of reviewing the plans, requiring corrections and resubmitting corrected plan sheets may continue until all the respective plan reviewers determine that all outstanding issues have been resolved and the permit can be issued by the appropriate governing agency.

A user may select one or more comments or groups of standard comments, and insert them with a command (e.g., a single command) into a permit/project plan review data record. Optionally, a user may choose to associate a comment with one or more plan review sheets and set an X/Y coordinate with a command (e.g., a single command). Optionally, comments that are associated with action items or that need to be reviewed (e.g., in progress reviews) may be assigned by respective departmental queues and displayed as such.

Comments may be displayed in one or more scrollable, collapsible panels/windows, optionally at the same time a plan drawing (sometimes referred to as a plan sheet) is displayed. Optionally, the system automatically and/or in response to a user command refreshes displayed comments so as to include any changes by other users.

Optionally, the system enables batch uploading of plans and supporting documents into the system by a user and further provides batch assembly of plan sheets and supporting documents into a file, such as a compressed vector file (e.g., a PDF formatted document compressed into a ZIP file). Optionally, the system enables the assembly of single sheet PDF documents into a multi-page PDF document.

Certain example user interfaces will be discussed with reference to the figures. It is understood the other embodiments of the user interfaces can include fewer or more features, and that a given user interface or a portion thereof can be combined with another user interface or a portion thereof.

Figure 2:
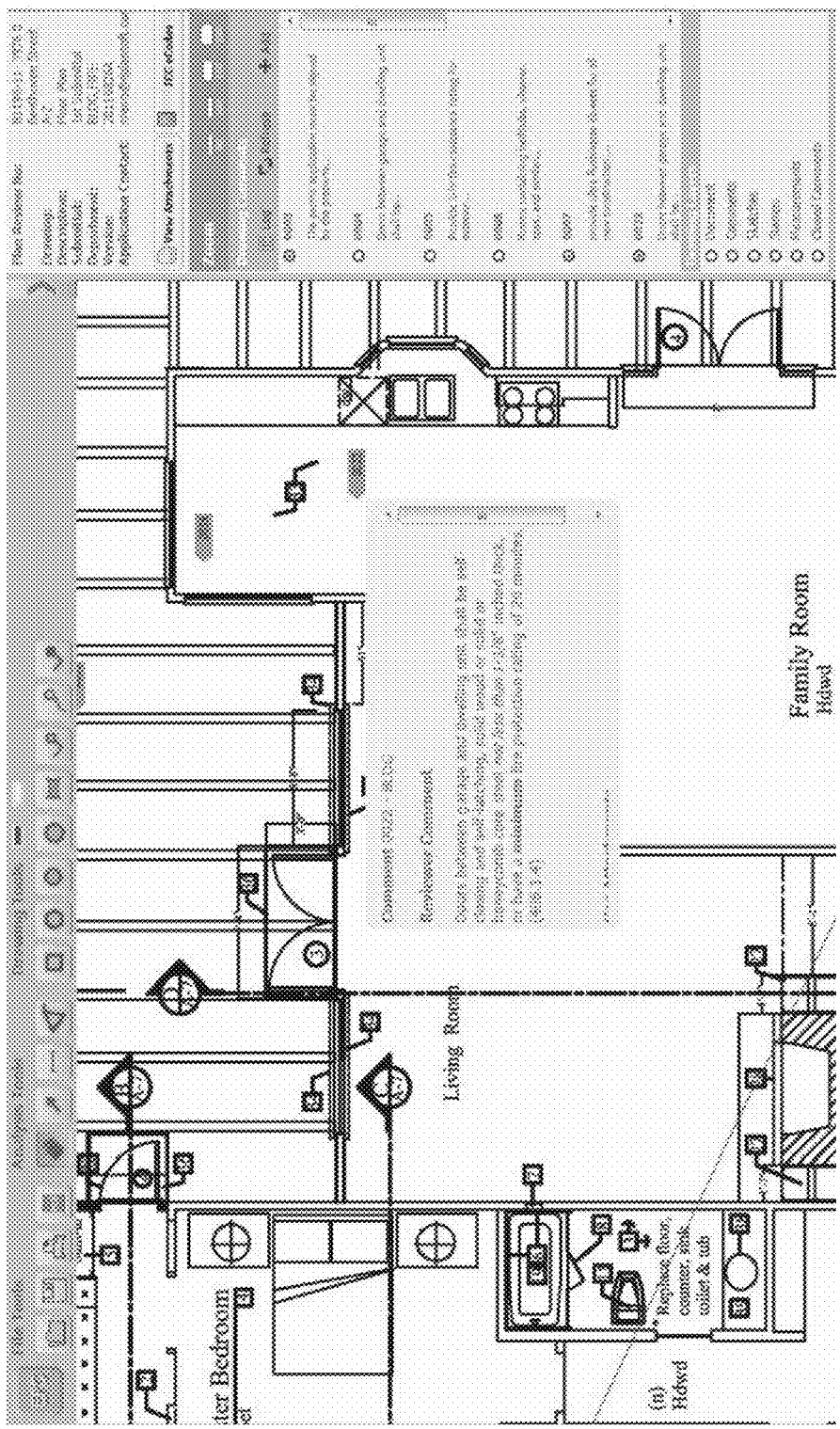

FIG. 2 illustrates an example drawing review user interface. The user interface contains a plan panel 202 displaying a building-related plan sheet, and related tools 204. A given plan sheet may have multiple layers. For example, a given plan sheet may include some or all of the following layers: document, comments (open and/or closed), sketches, approval stamps, measurements, or closed comments. The comments may include text and related documentation, such as video, still image, audio content which may be played or viewed (e.g., via a video player, an audio player, or an image viewer) in a window overlaying the displayed plan sheet (e.g., in a pop-up window), in a window/pane adjacent to the displayed plan sheet, or in a full screen mode. Controls, such as pause, play, rewind, fast rewind, forward, and/or fast forward may be provided enabling the user to control the playback of video or audio content.

Programmatically, the application may create virtual layers stacked on top of (or below) the plan review drawing which allows for sketches (boxes, circles, lines, etc.) to be managed as a whole for the particular sheet. In certain embodiments, the plan sheet may be disassembled as a series of image 'tiles' converted to another format (e.g., a PNG format) by a rendering engine. Additional layers for managing comments, digital stamps and measurements may also be created virtually.

The user can instruct the system to make a given layer invisible or visible. When requested, the plan sheet and associated layers, with their objects, can be assembled and re-rendered as a PDF document by the system. The information in a given layer may be provided/created by one or more entities, such as an architect, contractor, or plan checker/permit approver. The application provides the ability for multiple users to modify the same plan sheet concurrently, in substantially real time, and optionally ensures that a given modification made by a user is made visible to other users when a 'save' or 'refresh' operation is performed.

The tools may include drawing tools (e.g., to draw lines and shapes, add objects from a library, etc.), analysis tools, and file tools (e.g., save, open, PDF export, download, overlay, etc.). A summary pane 206 displays summary information regarding the displayed plan sheet, including for example, a unique plan identifier (e.g., a plan review number and/or physical address associated with the construction project), a drawing sheet number of the displayed plan sheet, a description (previously entered by a user), a submittal number (which may be used to manage/group plan sheets which have been corrected and resubmitted for subsequent plan check), department information (e.g., of departments or other organizational entities that are tasked with performing a plan review), version number, and application contact.

In response to a user activating the illustrated "view attachments" control, the plan management system will retrieve, from local or remote memory, and display previously stored related documents. Typical examples of such attachments may include a copy of the permit application, a soils study document, calculations (e.g., related to energy efficiency, square footage, etc.), a photo image (e.g., of the site or of a structure or part that may need repair, maintenance, inspection, etc.), a video file (e.g., of the site or of a structure or part that may need repair, maintenance, inspection, etc.), an audio file (e.g., of an inspector commenting on issues that the inspector identifies during a site inspection), a spreadsheet or word processing document saved in native or PDF format, etc. These documents may be annotated (e.g., textually, graphically, and/or with a voice recording as described elsewhere herein with respect to FIGS. 22-23) by the user and/or accessed by the user for viewing (e.g., by downloading or viewing via a browser) as well as for the digital application of a stamp or seal. In response to a user activating the illustrated codes ("ICC codes") control, the plan management system will access and retrieve from a remote standards database (e.g., the ICC (International Code Council) database), and provide the user with access to, some or all of the corresponding code tables. Optionally, a search field may be provided via which the user can search for particular ICC codes. Optionally, the search may be submitted to the remote database, which will conduct the search and return a result. Optionally instead, the search may be performed on a local copy of the ICC code tables. In either case, the user can add an associated ICC comment into the plan (e.g., into the plan panel 202 or the drawing comments area), and edit the pasted comment. This speeds up the comment entry process and reduces the amount of errors that may occur relative to a user manually typing in a code comment. Other industry standard code databases or websites can also be made available to provide the foregoing or similar functionality, as desired by the user.

Zoom controls 208 are provided via which the user can instruct the plan management system to zoom in or out, at various levels, with respect to the displayed sheet or other document.

A drawing comments area 210 lists the comments associated with the displayed plan sheet. If the space provided in the comment panel for a given comment is insufficient to display the entire comment at once, only a portion of the comment may be displayed in the panel (e.g., the first 50 characters). The comments list may be scrollable so that a user may scroll through a list that is longer than can be displayed in the area provided. A given comment may provide access to (e.g., via an included link) to a related document, such as a video file (e.g., of the site or of a structure or part that may need repair, maintenance, inspection, etc.), an image file, an audio file (e.g., of an inspector commenting on issues that the inspector identifies during a site inspection), which may be displayed using the example interface illustrated in FIG. 23. In this example, a given comment is associated with a unique comment identifier, referred to as a comment 'tag', with respect to the displayed plan sheet. In the illustrated example, the identifier is numerical, although the identifier may be an alphabetical, alphanumeric, graphical, and/or other type of identifier.

The user interface illustrated in FIG. 2 also provides a comment log control, which when activated causes the system to open a new page which generates a comprehensive table of comments for the given permit/project and any associated plan sheets (see FIGS. 9A, B, 10, and 11 which illustrate different sections of an example user interface), and metadata recorded by the system or user. This data may be filtered in a number of ways by the user and can be used to automatically generate a correction list for the permit applicant or end user, in response to a user activating a corrections report control provided via the comment log user interface. The comment log user interface page may include several sections, including, by way of example, a search panel, a search results panel and a comments editing detail panel, examples of which are described below with respect to other figures. The user may choose to select a comment from the list and choose an edit comment control which may allow for editing of the comment detail.

A refresh control is provided, which, when activated, causes the application to re-query the comments table for the particular permit/project to display any changes made since last refreshed. A "+" control is provided which, when activated, causes a comment data entry form (e.g., a single comment data entry form) to be displayed via which the user can enter a comment which will be added to the displayed plan sheet at a chosen X/Y coordinate. When a user clicks on the small open or closed circle placed to the left of the comment in the panel list, the system causes the plan image to shift until the selected comment identifier/tag is placed in substantially the center of the drawing review page.

When a user hovers a cursor or otherwise points to a given comment on the drawing review page, the comment is displayed in a pop-up window panel 202, optionally in association with an element in the plan (e.g., a structural, plumbing, electrical, or fixture element). For example, there may be a visual association between the comment and the element, such as a line connecting the comment to the element, or a highlighting of the element associated with the comment. The comment text may be displayed "in full" or at least to a greater extent than in the comment panel list. The user may also request that the plan management system format and display the comments via a PDF document, XML documents, or the like. As noted above, a given comment may provide access to and/or be presented in conjunction with a related document.

A drawing layers control 212 is provided via which the user can specify which layer of the plan sheet is to be displayed (e.g., document, comments, sketches, approval stamps, measurements, closed comments, etc.).

Figure 3:
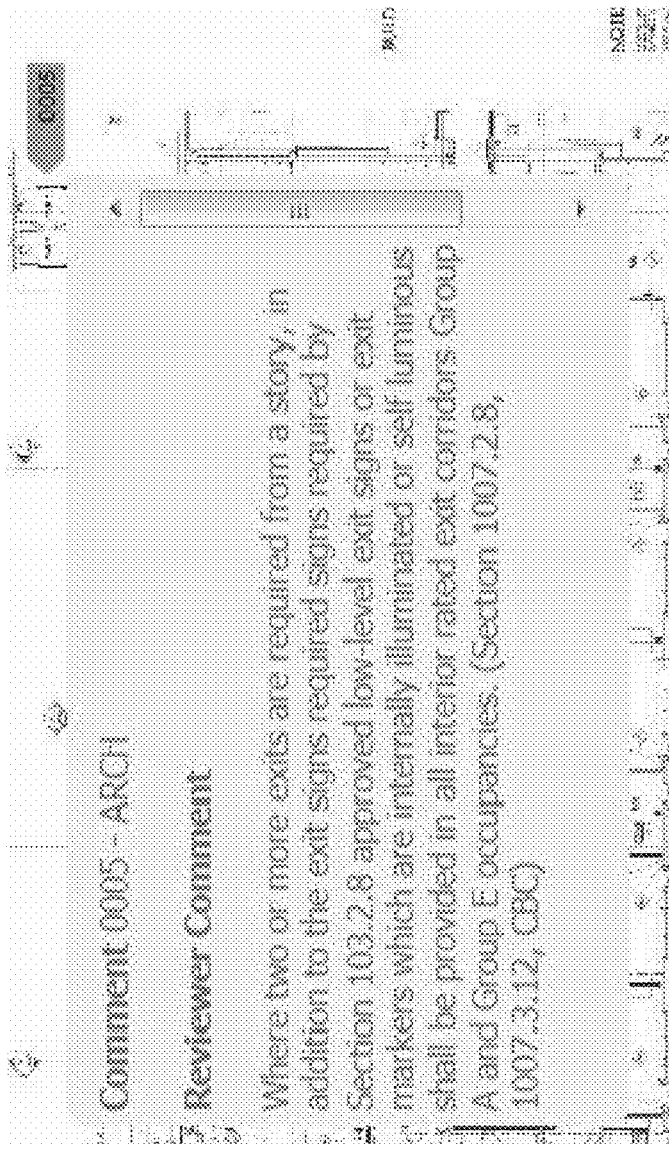

FIG. 3 illustrates an example comment in a pop-up window. The comment includes a departmental identifier in association with the assigned comment tag number shown in the comment list or panel control.

Figure 4:
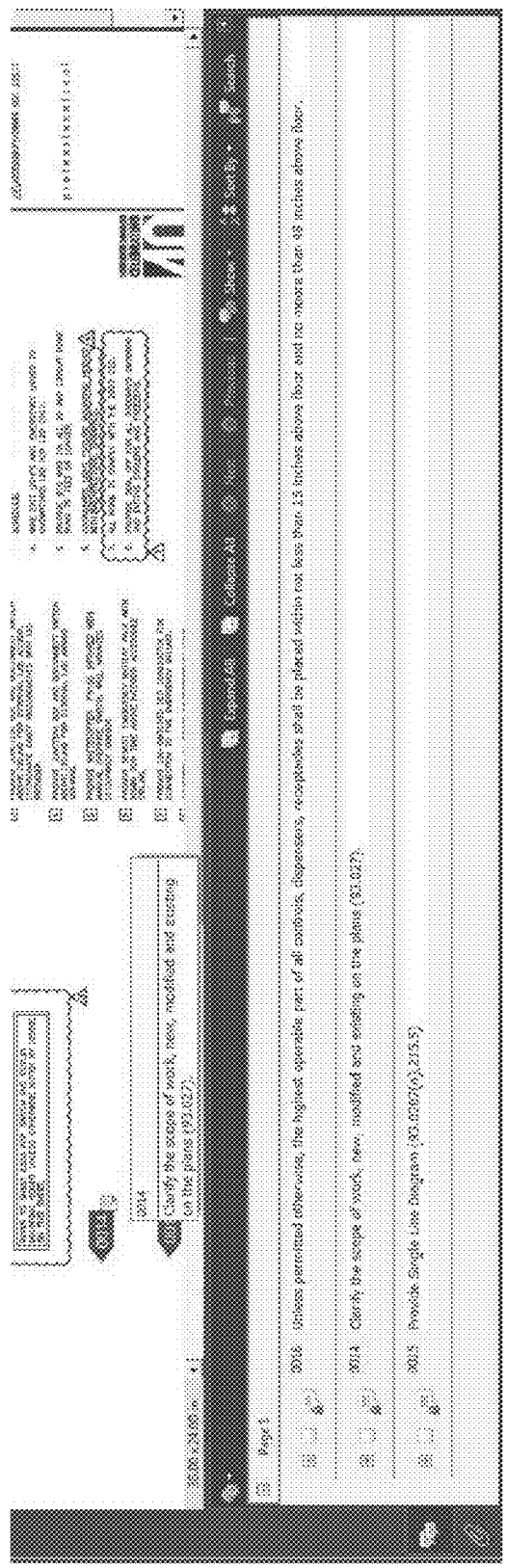

As illustrated in FIG. 4, the plan management system is configured to generate a PDF document (or other specified document format) of the plan sheet including sketches, stamps and other modifications, accessible by a PDF viewer application (or other applicable view application), which properly displays the comment identifier tags, comments as pop-up windows and an embedded list of comments from the comments table.

As noted above, the plan management system facilitates plan checking. For example, a plan may be submitted for approval, such as to a governmental agency, for plan check. Multiple departments may be involved in the plan check process, such as a building department, fire department, water department. In an example embodiment, after intake for plan check, a drawing status for given plan sheet and a respective assigned department is set (automatically or manually) to 'Not Started,' and the drawing records are sent to a queue for pickup by the appropriate department or an assigned user. Once a departmental plan checker starts their departmental review, the plan management system will change the sheet status—for that department—from 'Not Started' to 'WIP' (work in progress). As a permit status or departmental workflow statuses are changed, the plan management system creates an audit record in the event log table.

After the departmental review is completed for the plan sheet, the plan checker may change the workflow status to 'Approved' or, if there is a correction need, to 'Resubmit'.

The plan management system may monitor the status of each plan sheet with respect to each department, and when the plan management system determines each departmental review has been completed, (e.g., all the drawing statuses have been set to Approved or Resubmit), the plan management system automatically changes the permit status to 'Ready to Issue' and notifies the appropriate personnel (e.g., permit supervisor) via email, instant messaging, SMS, MMS, or otherwise.

Figure 5:
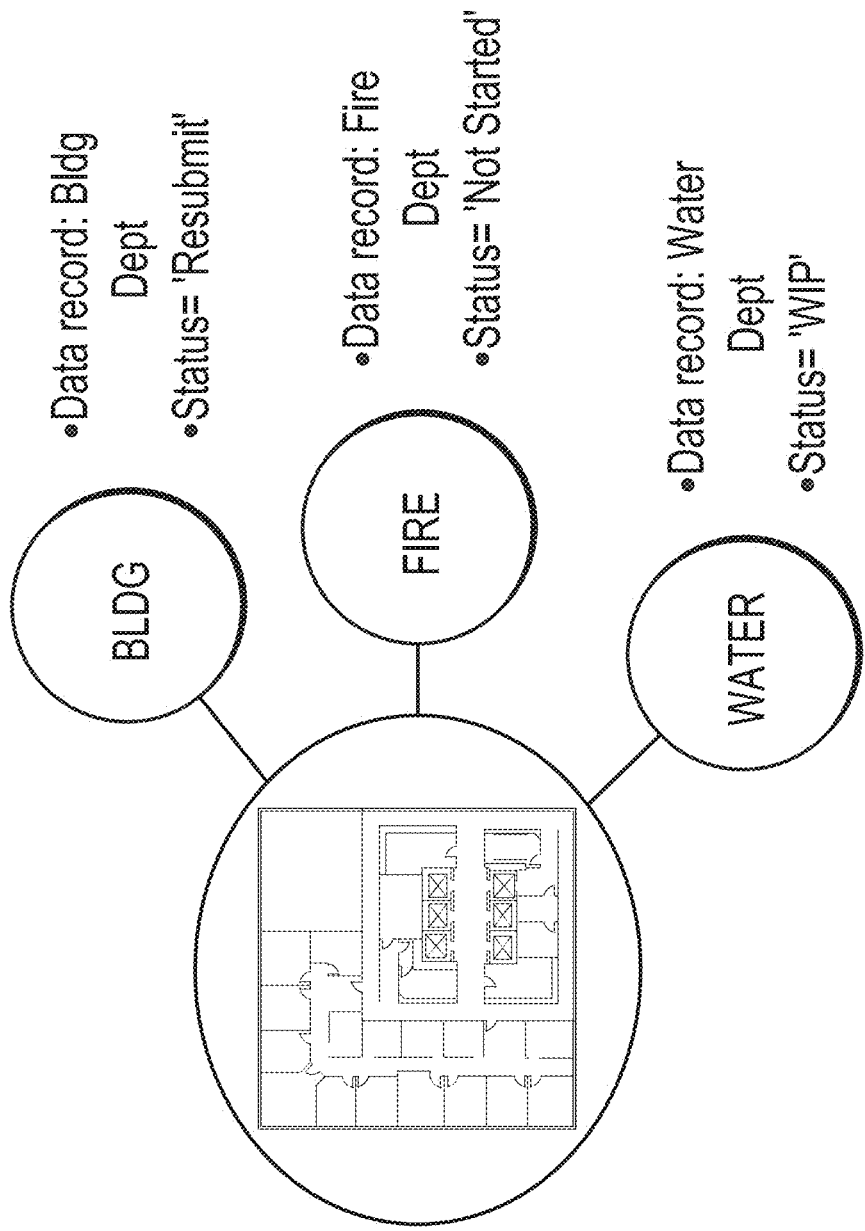

FIG. 5 illustrates an example workflow assignment. In this example, three departments (Building, Fire and Water), each with an associated data record and workflow, are assigned to review the same plan sheet. Each department can assign their own review disposition/status (e.g., resubmit for approval, not started, work in progress, etc.). Thus, the drawing data records created for a given sheet and associated with a given department may be managed via the department's own workflow process.

As noted above, the plan management system may provide a library of commonly used or standard comments which optionally come pre-populated with a standard installation of the plan management system, or which can be imported into the standard comment table by a user. A user may select and customize a standard comment from the library or create a new standard comment, which can be selected by a plan review user to link to/associate with a given plan sheet (and/or related document) or to include in permit/project review as a whole, without a specific sheet assignment. Thus users/administrators are provided the ability to customize the standard comments and review comments to fit the needs and terminology of their particular agency via a list management user interface.

FIG. 6 illustrates a table of lists describing example uses for various items of metadata, although the metadata can be used for other purposes as well. As illustrated, metadata includes a category (which may be used to manage, group and sort a given plan reviewer's comments and corrections, such as those included in a correction list). In addition, a code table is provided, which identifies code tables (e.g., IRC (International Residential Code), CBC (California Building Code), etc.) used with a relevant agency, such as a governmental plan check agency. The metadata may also include a contact method, a construction type code (e.g., as specified in a code table), a contact method for the applicant/owner, a department identifier for a user or plan, acceptable drawing sheet dimensions as specified by a relevant governmental agency, a list of industry standard disciplines, a compass direction associated with an address for the property corresponding to the plan, disposition of a comment (e.g., open, closed, etc.), document type (corresponding to a value for an incoming file and/or attachment received by the plan check system, and impact, which defines the importance designation for a plan reviewer comment (e.g., open, closed, etc.), and occupancy codes as published by an agency (e.g., industry code as published by the CBC in 2012). The metadata may also include a permit priority (e.g., agency-specific terms reflecting the priority of the permit application and/or expected turnaround by the reviewing agency (e.g., overnight, high, normal, etc.), permit type (e.g., agency specific terminology: roof, pool, electrical, etc.), project type (e.g., agency specific terminology: residential, commercial, zoning), street type (e.g., commonly used street type designations, such as avenue, boulevard, zoning, etc.), sub-category (e.g., an agency list and sort order of comments that will be used on the correction list), and submittal (e.g., agency specific permit submittal language (e.g., $1^{st}$, $2^{nd}$, $3^{rd}$, etc.).

A system list may include access (e.g., manager user roles and system security roles), permit status (e.g., defines current workflow status of a permit record, such as open, on hold, withdrawn, ready to issue, issued and resubmit, etc.), and drawing status (e.g., defining the current workflow review status of a drawing, such as not started, WIP (work in progress), resubmit, and approved).

Each agency/department may edit a descriptive item label, and assign its own alpha/numeric codes to a given entry. These lists may be presented throughout the plan management system user interfaces, such as in dropdown controls or menus that are used for filtering, searching and sorting comments, as well as in generated reports, such in report graphs, charts and timelines.

Figure 7:
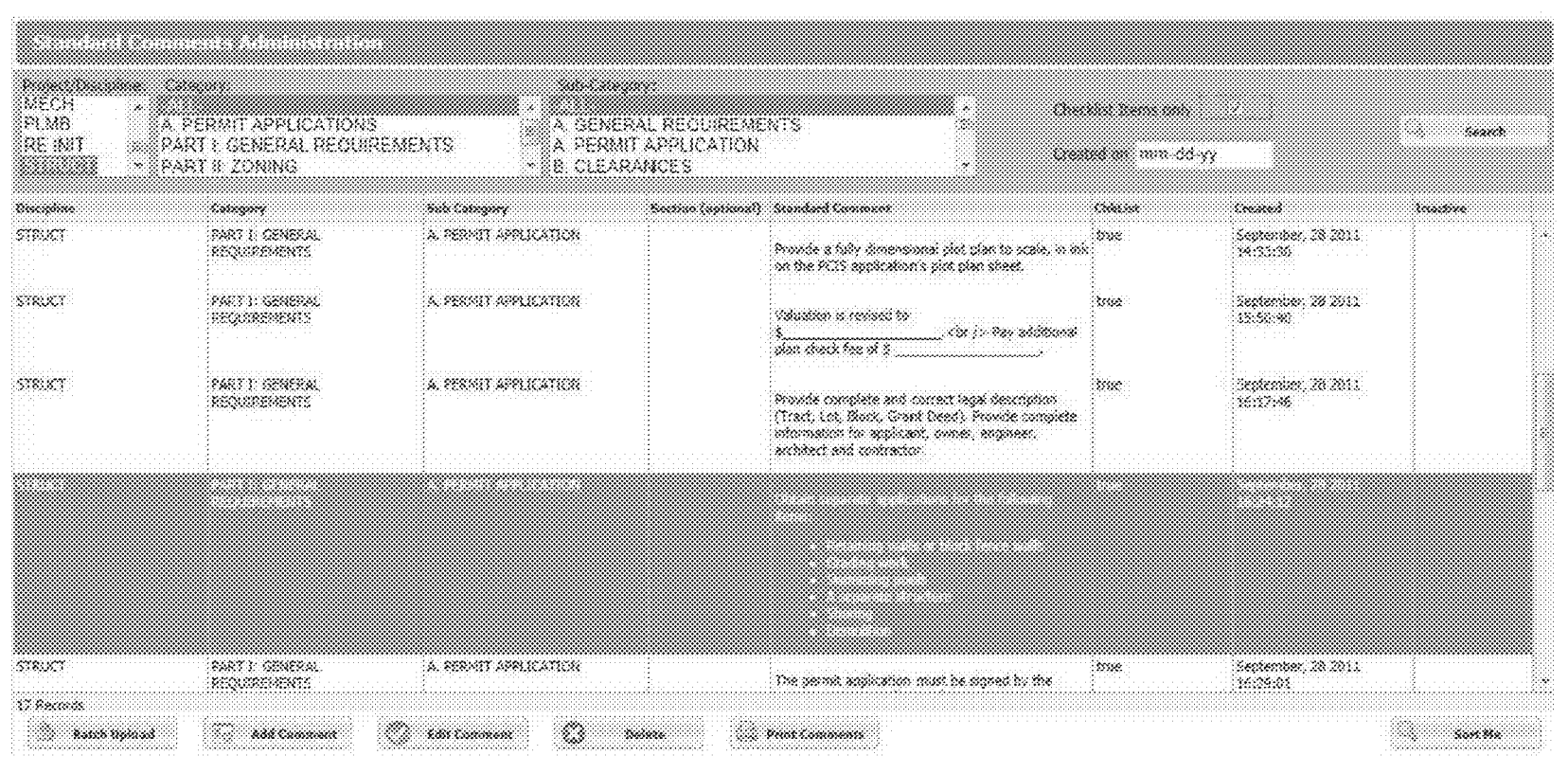

FIG. 7 illustrates an example administrator user interface for administering and managing standardized comments, where end users may then add the comments to plan sheets, checklists, or other project related documents. Administrators can batch upload standard comments, classify a given record by discipline or project type, category and sub-category, and/or checklist identifier. This helps manage comments, and defines the grouping and sorting of correction list reports. For example, an administrator may mark certain comments as being "checklist" comments via a checklist field (e.g., the Chklst column), where a checklist item has to be checked off in order to receive plan approval. The user interface further enables an administrator to specify a project type, discipline, a category, and a sub-category for a comment. For example, project type or discipline may include "mechanical," "plumbing", "RE INIT (Residential Initial Review)," "structural," etc. The categories may include "A. Permit Applications," "Part 1: General Requirements", "Part II: Zoning," etc. The subcategories may include "A. General Requirements," "A. Permit Application," "B. Clearances," etc. The values displayed in the dropdown boxes can be edited and updated by the users, so the data in each list may vary from agency to agency.

A sort control may be provided, which, when activated by a user, sorts the comments to preview the order in which the comments will appear in the correction list. The user interface enables the user to specify what sheet comments (which may include comments associated with a video, image, or audio document and a link to such documents) are to be included in a correction list, the order and groupings in which the comments are to be presented, and the appearance of the comment text (bolding, italicized, etc.). For example, the user may want to specify that general comments are displayed above structural comments, application comments are to be displayed above administration comments, etc. The user interface may enable the user to sort on discipline or project type, category and subcategory, a free form text field labeled 'section' for storing building code information, the text of the standard comment, media type (e.g., video, still image, audio, textual, or some combination of the foregoing), checklist flag, creation date, and status (e.g., active or inactive). As discussed with respect to FIG. 18, the plan management system can render a customized correction list report in accordance with the user's specifications. The system may inhibit comments designated with an inactive status from being displayed to plan reviewers via the search tool of the standard comment library.

As similarly noted above, administrators can batch upload standard comments into the standard comment table from a document, such as an XLS or CSV document, before or after which, a user may format the standard comments to reflect bolding, italicizing, bullet and numbering and hyperlink formatting, classify a given comment record by discipline or project type, category and sub-category, and flag a given standard comment as a 'checklist' (or required for review) item, as illustrated in FIG. 7. This ability to classify comments not only helps manage the comment library, it also enables a user to locate a desired comment quickly and efficiently, but may also be used to define the grouping and sorting and placement of the comments on the correction list reports.

As illustrated in FIG. 7, an "add comment" control is provided to allow a user to manually add a record to the standard comment table. A print control causes the application to open a report of the comments in a PDF document. A search control is provided via which the administrator can search for standard comments by specifying query text and optionally fields where the text is to be found.

Figure 8:
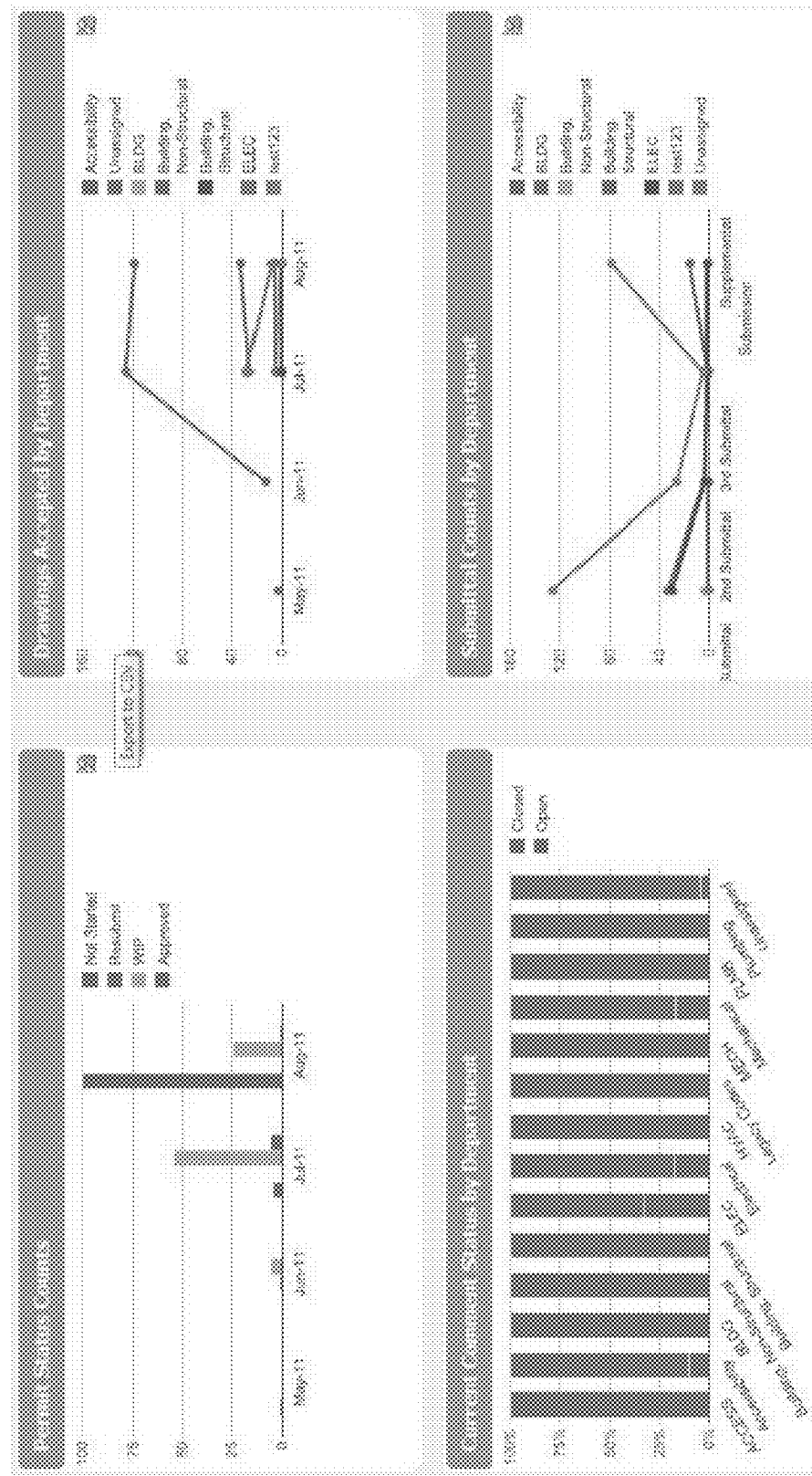

The plan management system can record and track, in substantially real time, users' actions and permit status. For example, the plan management system can track how many permits have not started the review process, the number of resubmits, the number of work in progress, or approved overall and/or by department. The plan management system can also track comment status by department (e.g., how many are open or closed), how many drawings have been accepted by department, and submittal counts by department. The plan management system can analyze the recorded information and generate reports in substantially real time, including graphs, reporting the foregoing information. For example, a report can be generated reporting permit count status for each status type for one or more periods (e.g., on a month by month basis) using a bar-type graph. Further, the plan management system can generate a report of current comment status by department, submittal counts by department, and drawings accepted by department. Example graphical reports are illustrated in FIG. 8. The recorded and reported information can be exported via one or more different formats, such in a CSV, RTF or DOC file, or other word processing, spreadsheet, or database document/file and may include media attachments, such as video, image, and/or audio file attachments.

Figure 9A:
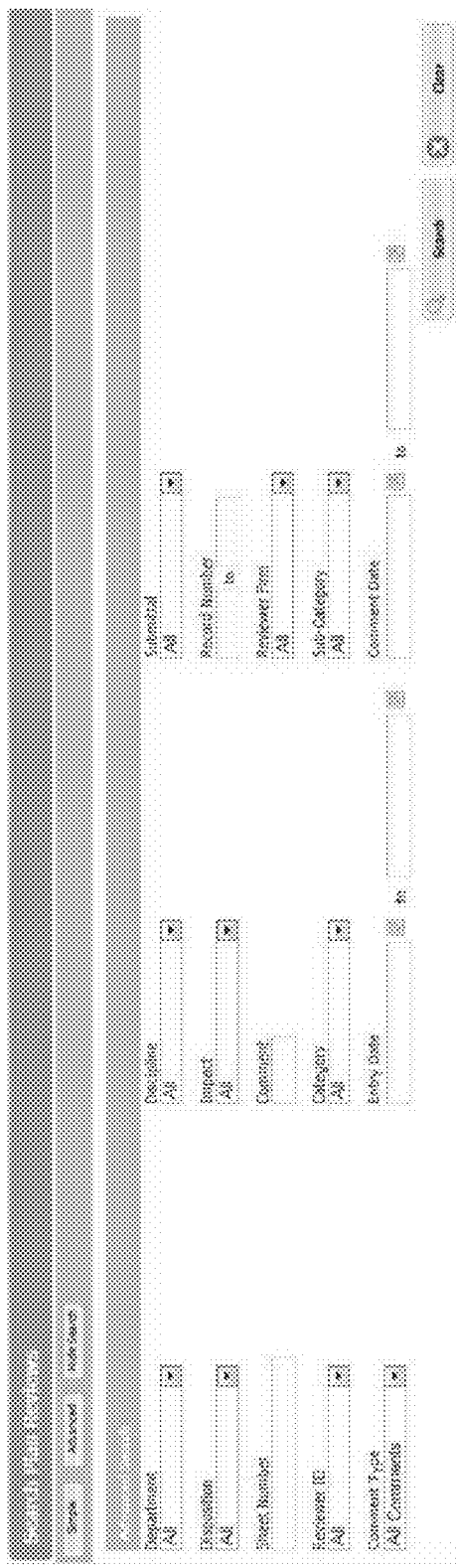

As discussed above, certain embodiments of the system provide extensive search facilities. As illustrated in FIG. 9A, a search user interface enables a user to search for comments based on some or all of the following criteria: by department, disposition/status, reviewer ID, sheet number, comment type, media type (e.g., video, still image, audio, textual, or any combination of the foregoing), discipline or project type (e.g., electrical, plumbing, structural, etc.), comment text, category, sub-category, submittal identifier, record number range, reviewer firm, comment date range, etc. Thus, using the illustrated user interface, a plan checker can search for and view comments placed by any user in any department (unless otherwise restricted by an administrator). The user interface enables, for example, a department to group and sort their correction lists by categories and subcategories. An administrator can specify which users may edit, add, and/or delete comments (e.g., based on user roles).

A user can also search the standard comments library for a desired/appropriate comment, and then, via the search results, select and insert one or more located comments into the comment log table for a permit/project as well as on a specific plan review sheet. Then, as similarly described above, on the plan review sheet, tagged comments are displayed in a list in automatically numbered tags. The tagged comments appear as pop-ups over the plan sheet (optionally in association with the item being commented on) when a user hovers a cursor over the comment in the list. A tagged comment may optionally include an x/y coordinate indicating the item in the plan sheet that the comment is associated with or where the comment is to be displayed. The system may substantially center the portion of the plan sheet corresponding to the x/y coordinate in the plan sheet review display area.

FIGS. 9a, 9b, 10 and 11 depict snapshots of an example Comment log page.

Figure 9B:
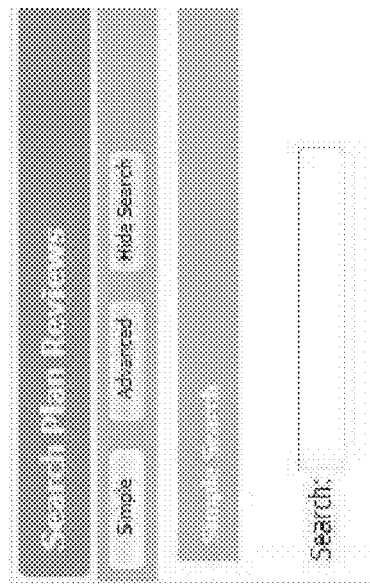

Referring to FIG. 9A, a "simple" search control is provided, which when activated, causes a simple text search user interface to be displayed, as illustrated in FIG. 9B. The user can enter a text string and the plan management system search engine will search for matching comments, and return the matching comments for display to the user. The illustrated example simple search interface does not include additional filtering menus.

Figure 12:
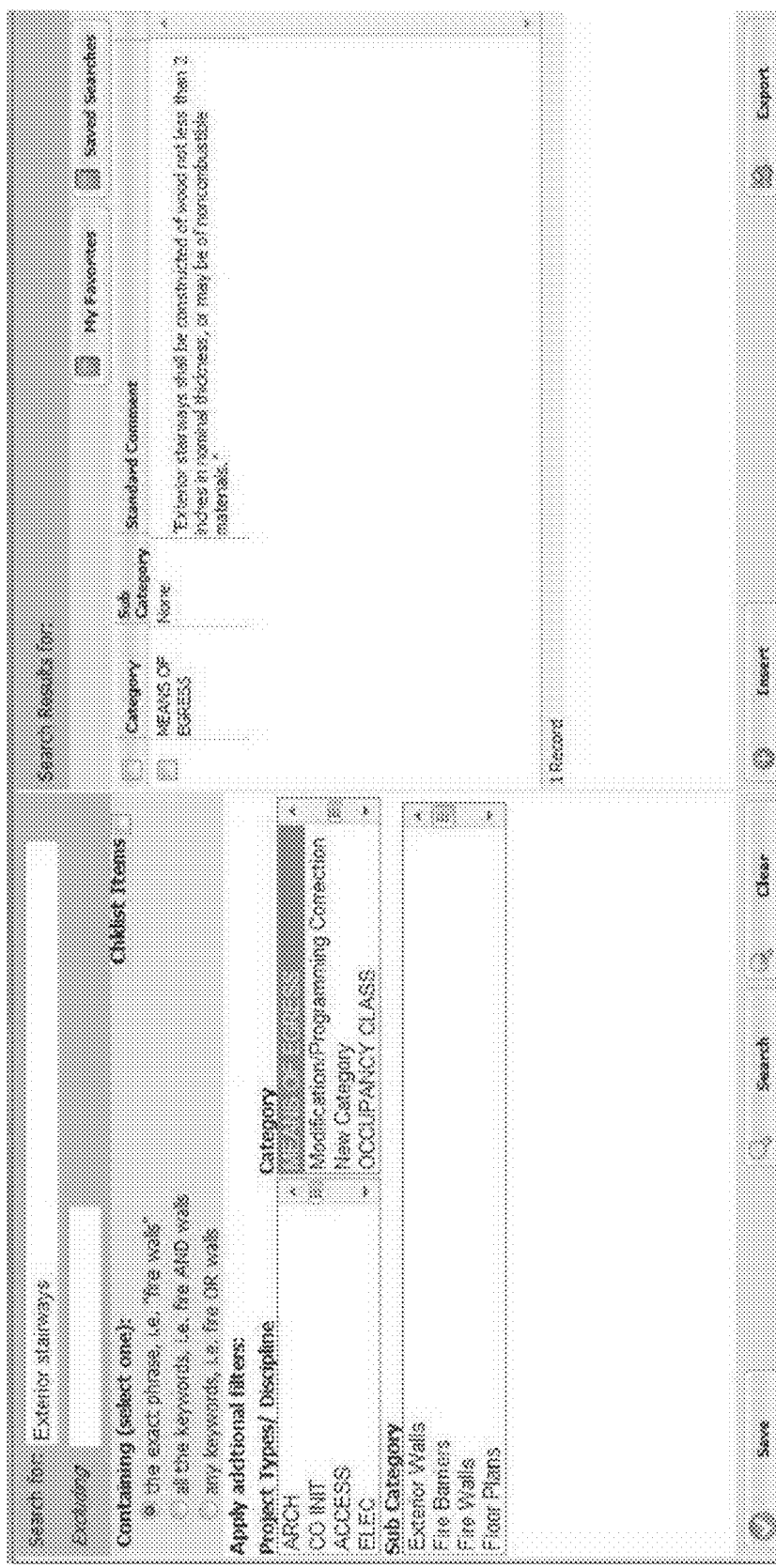

Referring again to FIG. 9A, an "advanced" search control is provided, which when activated, causes an advanced search user interface to be displayed, providing extensive user selectable filtering of comments by department, discipline or project type, category, sub-category, submittal, disposition, impact, sheet number, user, date ranges, etc., optionally in addition to providing a field configured to receive a textual search string. Examples of advanced search user interfaces are illustrated in FIGS. 9A and 12.

Figure 10:
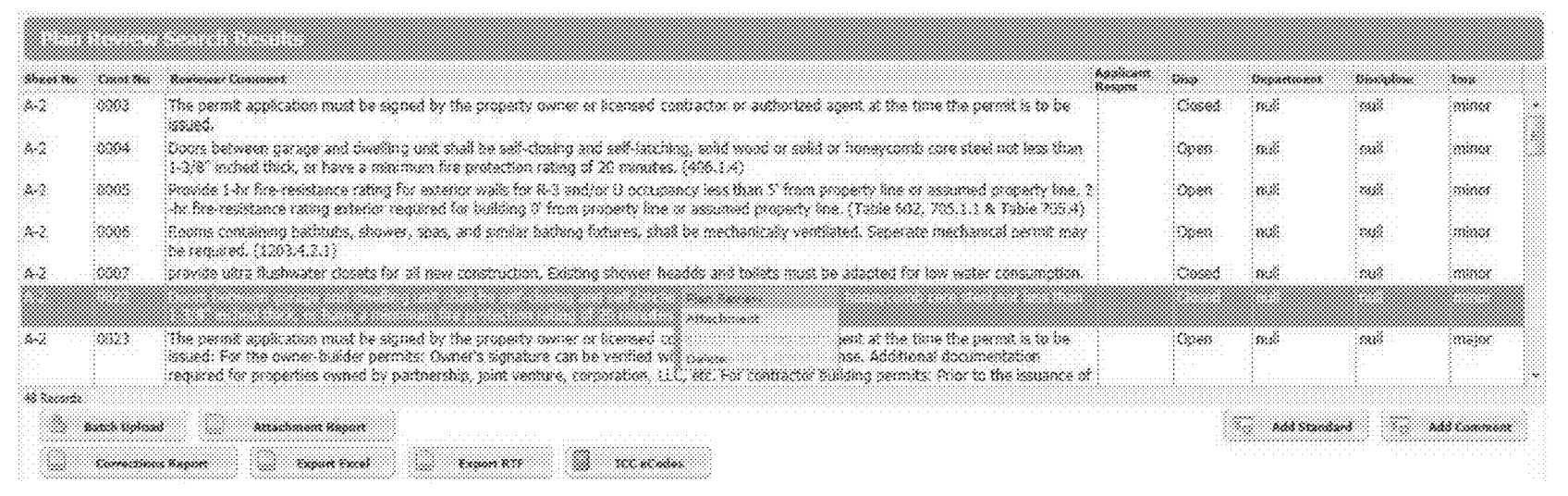

FIG. 10 illustrates an example search result for a search performed using the search user interface of FIG. 9. The search results in this example are presented via a table, including columns corresponding to sheet number, comment number, comment text, applicant response, disposition, department, discipline or project type, and impact. An upload control is provided via the search result user interface, enabling users to upload attachments in a desired format to a specific, user-selected comment record which the plan management system links to the comment. These uploaded files are retained as 'attachments' and can be returned to the permit applicant with the plan comments. An attachment report control is provided which when activated causes a new window to open, displaying a report (e.g., in PDF format) including the file name, department, plan sheet number and comment text of any external documents which have been uploaded and linked to one or more comments. (See FIG. 16b). A comment report control is provided which when activated causes a comment report to be generated, as described elsewhere herein. Controls are provided via which a user can instruct the plan management system to export the search report, or a user selected portion thereof, to a file in a specified format (e.g., Excel, RTF, etc.). An "ICC code" control is provided, which when activated, causes the plan management system to retrieve from a remote standards database (the ICC database in this example) some or all of the ICC code tables, and display or otherwise provide user access to the codes.

As illustrated in FIG. 10, a pop-up menu is optionally provided, which may be accessed via a mouse click or otherwise. The pop-up menu includes a plan review option. If the comment record contains coordinates with respect to the plan sheet (e.g., x/y or polar coordinates), activating the plan review option causes the plan management system to open the drawing and the corresponding comment tag in a new window. The pop-up menu may also include an attachment option. If the comment is linked to an attachment (e.g., a video, still image, audio, and/or text attachment), activating the attachment option will cause the plan management system to open the selected file in a new window. The pop-up menu may also include a delete option, which when activated causes the plan management system to delete a comment selected by the user if the user has rights to make such a deletion. FIG. 10 also provides an "add standard" control which causes the application to active the standard comment search interface (see FIG. 12).

FIG. 11 illustrates a single comment detail user interface for viewing. If a user selects a comment record from the search results of FIG. 10, the plan management system will provide for display details for the selected comment in an Add/Edit Comment area/pane. The comment detail user interface displays various metadata associated with the comment, such as department, disposition/status, reviewer ID, sheet number, comment type, discipline or project type (e.g., electrical, plumbing, structural, etc.), comment text, names/descriptions of associated documents, category, submittal, record number range, reviewer firm, sub-category, and/or comment date range. In addition, the comment detail page provides the history of the comment, back-checks (e.g., internal or public comments to original comment—where multiple levels of comments may be recorded and displayed), etc. If the user selects the edit comment control, the system activates a data entry interface (See, e.g., FIG. 15).

FIG. 12 illustrates an example user interface for performing searches, including Boolean searches, of standard comments. A field is provided via which the user can enter a search string. In addition, the user can specify via respective controls whether the plan management system search engine is to only identify comments including the exact phrase entered into the search field, all comments that include all the words of the search query (but not necessarily in the same order or directly adjacent to one another), or comments that include any of the words included in the search query. In addition, filter menus are provided via which the user can select/specify additional search limitations. For example, a user may specify that only comments associated with a specific project type/discipline (e.g., architect, access, electrical, etc.), category (e.g., means of egress, modification/programming correction, new category, occupancy class, etc.), and/or subcategory (e.g., exterior walls, fire barriers, fire walls, floor plans, etc.), in addition to matching the search string, are to be identified to the user.

The right side of the user interface illustrated in FIG. 12 displays the matching comment(s) identified by the search engine, including the parameters that match the additional filters (e.g., category, subcategory, etc.), in a sortable table (which may be sorted on one or more of the table fields). A checkbox filter option labeled 'ChkList' is provided in association with a given search result which if chosen, will cause the system to retrieve and/or display only those standard comments which have been designated as a checklist item. A "Select all" checkbox is provided to the left of the Category column in this example, via which the user can select or unselect all of the comments provided in the search results.

Figure 13:
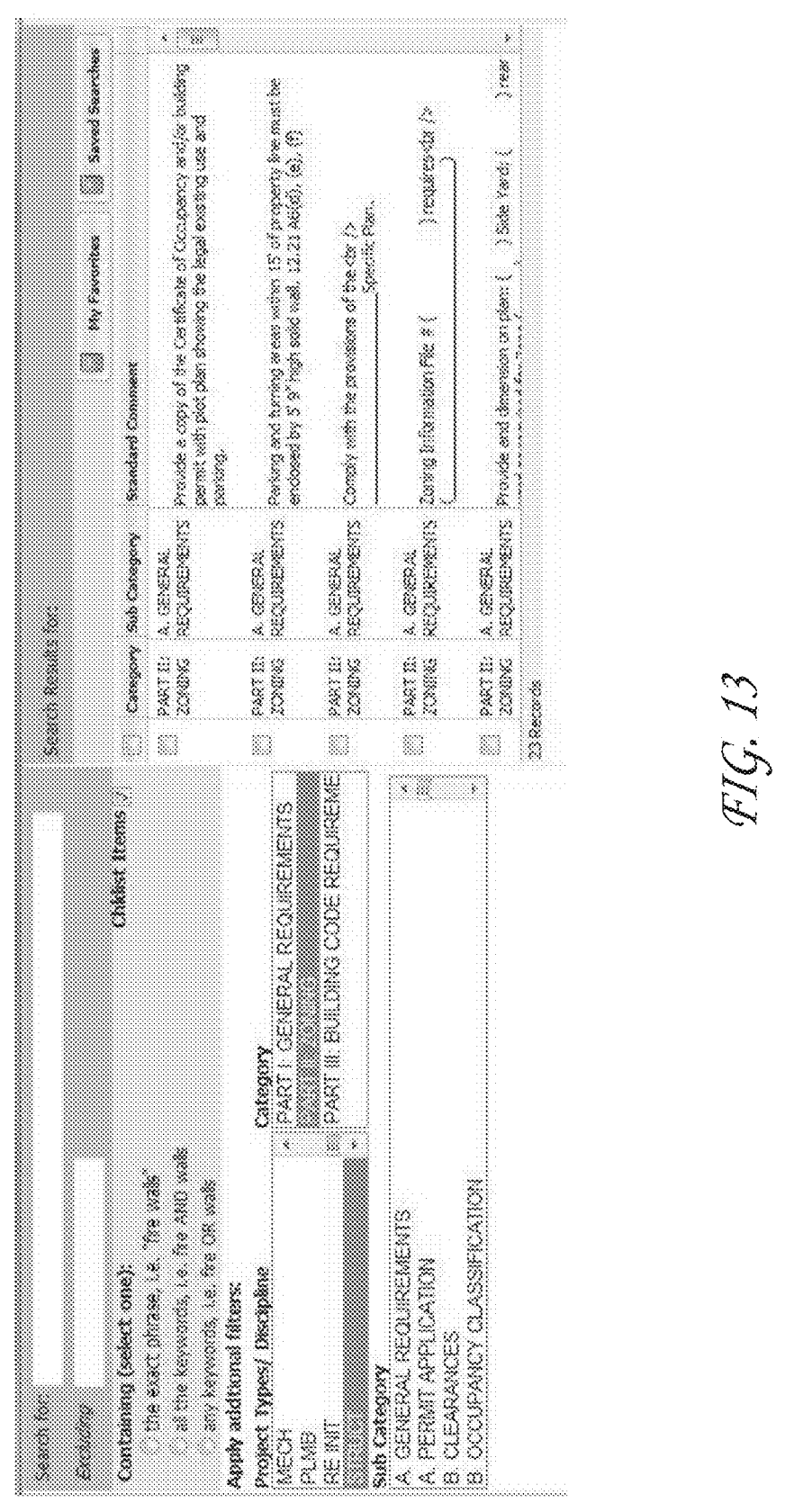

FIG. 13 illustrates an example standard comment search result. In this example, no search text was entered into the search field, but several filter items were selected by the user. In particular, the user selected structural comments (comments associated with the structural discipline) assigned to the zoning category. The search engine returns matching standard comments in the scrollable, sortable, search results panel on the right, including the category and subcategory parameters, and optionally with an identification of and/or link to associated documents. The user may select, by checking an appropriate check box, one or more comments, which will then be automatically copied from the standard comment table to the permit/project's comment table, where they may then be associated with one or more plan sheets. These comments then may be published on the correction list provided to the applicant. After the applicant/owner has corrected the noted items, the applicant/owner may resubmit the corrected plans for another review.

FIG. 14 illustrates an example saved standard search control. A user can perform a search of the standard comment table and choose to save the search query for later use as a favorite or otherwise by activating a save search control, and entering a descriptive search name. The user may select an option control to indicate how the search terms should be handled by database query, such as exact phrase, all the keywords, any of the key words in order to show the query parameters that were entered and saved by the user. The user may also select a checklist items checkbox as appropriate. The user may later retrieve the saved search query by name, and search for comments using the retrieved search query.

Figure 15:
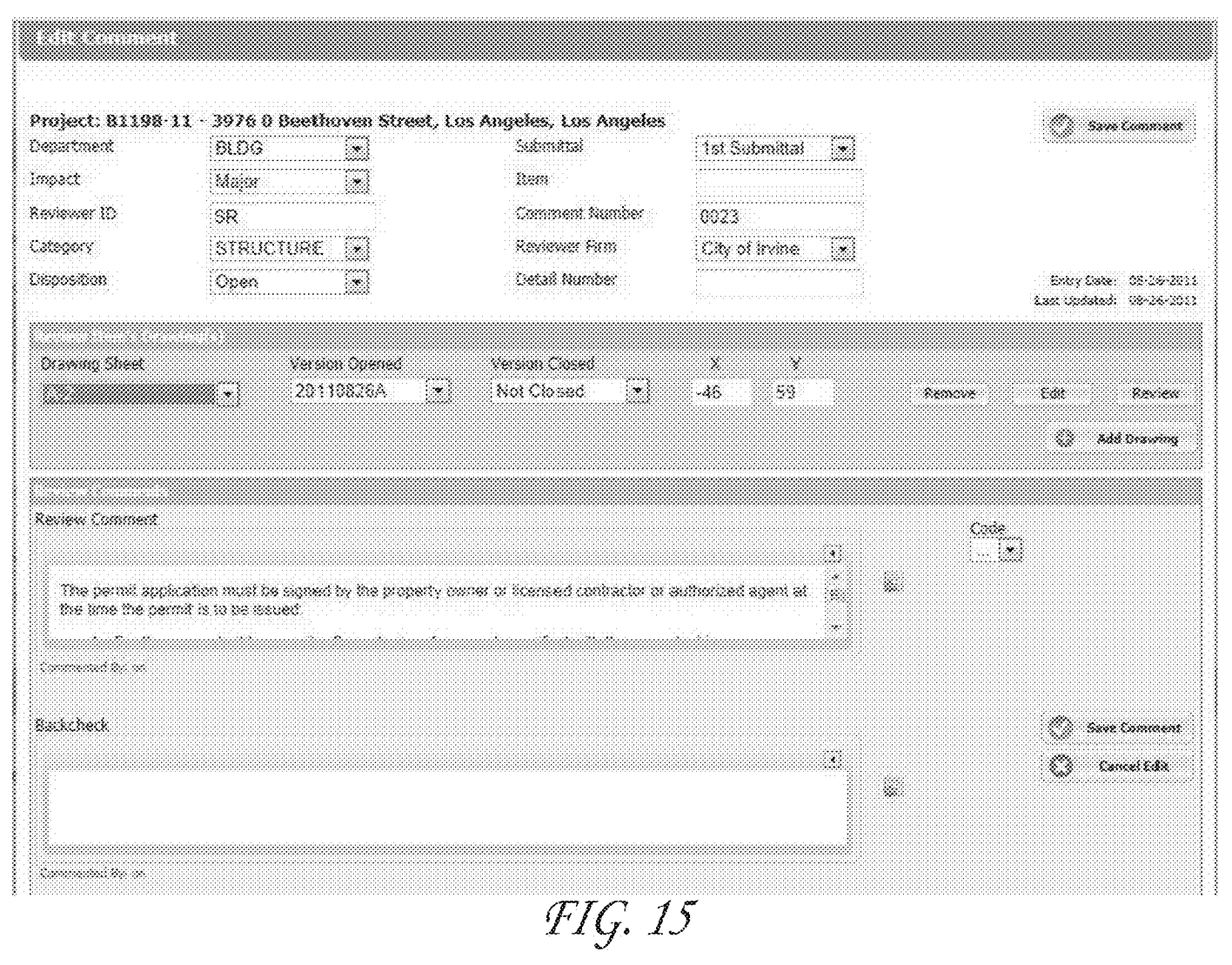

FIG. 15 illustrates an example user interface for editing a reviewer's comment. A user editing or drafting a comment can select from one or more menus and/or enter into one or more fields a variety of properties to be associated with a comment, and which may be used to group and sort comments. For example, a user can specify a department, comment impact (e.g., major, minor, medium), category, disposition (e.g., open, closed, etc.), submittal number (e.g., $1^{st}$, $2^{nd}$, $3^{rd}$ submittal), item (e.g., used to add additional information, if desired), comment number (which may be unique to the respective plan sheet), reviewer organization/firm (e.g., municipality, architect, contractor, etc.), and/or detail number. Fields and/or menus are provided via which a user can specify the relevant drawing sheet, version open (in such embodiments where the system will only allow comments to be placed on the most recent version of a plan sheet, so version opened and version closed controls will display each version for reference purposes only), and coordinates (e.g., X/Y or polar coordinates). The user can activate a remove control to delete the comment, an edit control to edit the comment, and a review control to preview, in a "review comment" field, how the comment will look when presented via the comment list. Rich text features (e.g., for adding bolding, italics, numbering and bullets) and hyperlinks may be used in editing the comments. A backcheck field is provided for recording subsequent notes about the initial review comments. A $2^{nd}$ backcheck field is provided to record a response to a back check comment.

FIGS. 16a and 16b illustrate another version of a user interface for editing a plan review comment. This example has fields for receiving and/or displaying the following: reviewer, submittal number (e.g., $1^{st}$ submittal, $2^{nd}$ submittal), department, discipline, impact, item, comment number, category, sub-category, disposition (e.g., open, closed, etc.), detail number, and reviewer comment. Optionally, the values in the category and sub-category menus (and/or in other menus) may be customized by a user/administrator. The values selected an end user/plan checker enables the comments to be automatically grouped and sorted in a correction list report returned to a permit applicant. The comment and field values may be saved to the database by activating a "save comments" control. The item field is provided to receive additional information that users/plan checkers may wish to include on the correction list. The detail number field is also available for other notations, as needed or desired.

FIG. 16b illustrates additional comment fields for optionally including backcheck comments following reviews of resubmitted plans. A given comment field supports formatting controls for bolding, italicizing, bulleting and numbering. Additionally, a file upload and attachment control is provided which allows the user to attach an external document in any format to the associated comment record. These attachments may differ from the attachments linked to the permit/project under review in that they themselves may be provided for the applicant's use or information, rather than as a supporting document which needs to be approved by the plan reviewer or agency.

FIG. 17 illustrates an example user interface for associating a comment which has been added to the permit/project comment table to one or more specific plan sheets. Fields are provided via which a user can specify a sheet number, and view any sheet version opened date stamp, a version closed date stamp, and coordinates specifying the location where the comment tag is to be linked graphically on the plan review image. A new or existing comment can be linked to a specified plan sheet number and open or most recent version by selecting the sheet number from the drawing sheet control. The same comment can optionally be linked graphically to any other sheet belonging to a respective permit by activating the 'Add Drawing' control and then specifying the drawing sheet number. Additional controls for removing the comment from a plan sheet, for opening the drawing sheet on the review page, and for auto-centering the comment on the screen are also provided for the user.

Figure 18:
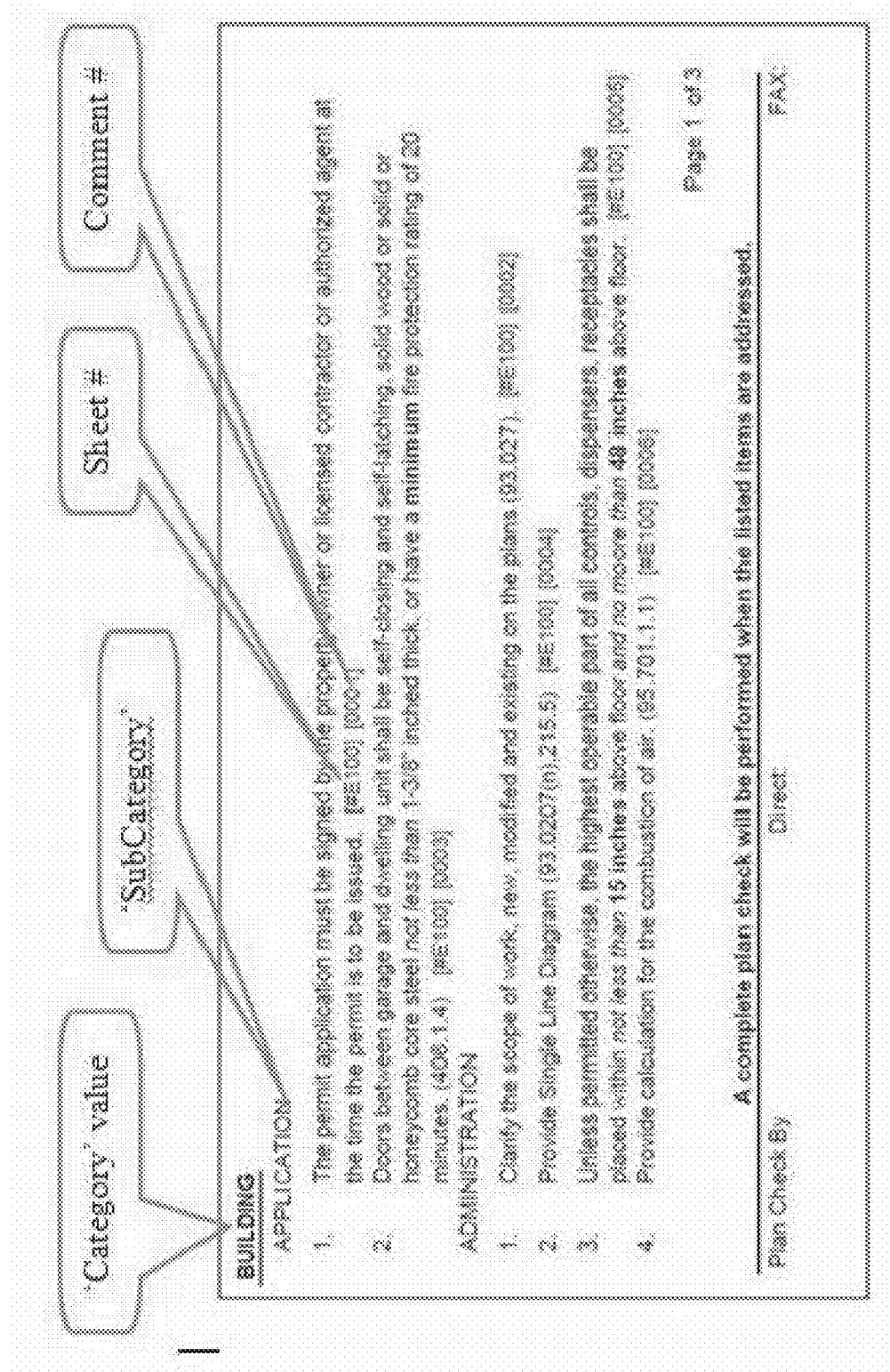

FIG. 18 illustrates an example correction list report. Using the automatic numbering of comments, and the built in association of a given comment to a discipline, category and sub-category list, each with their own order by value, the plan management system can produce a correction list report, with rich text formatting over which a user can manage the primary (discipline), secondary (category) and tertiary (sub-category) header names used in the report template. Thus, the user can manually, or the system can automatically generate a polished correction report using plan sheet comments, customized to a given entity's/agency's needs or specifications. Optionally, the correction list can aggregate and integrate plan review markups and comments (including associated documents) from multiple departments into a single report, eliminating or reducing the need for each department involved in the plan check to issue its own separate report. The user may tightly or loosely control which comments to include on the correction list by selecting/setting one or more dropdown controls available in the search plan review interface as shown in FIG. 9a or FIG. 9B.

In this example, the correction list is organized to list the category "building" comments first, and within the category of building comments, to list the application subcategory comments first and the administration subcategory comments second. The system may access and display in association with a given comment an associated sheet identifier (e.g., [#E100]) of the plan sheet the comment is associated with and a comment tag number (e.g., [0004]). The comments may include corresponding building code numbers/ identifiers where the comments are extracted from a building code data store (e.g., the ICC code table). The correction list report may also identify who is performing the plan check and the plan checker's contact information. Users can preview the permit's corrections/comments log by activating a preview control.

As noted above, certain embodiments enable a user to batch import standard comments into the system and to record metadata for each review comment. FIG. 19 illustrates a list interface illustrating certain metadata assigned to lists being imported. A list type is selected (e.g., Disciplines or Project types, Category, Subcategory). An order value may be assigned which may be used by the system to sort the correction list headings in numerical order in accordance with the order number (e.g., display order 1 comments before, order 2 comments, display order comments before order 3 comments, etc.). A primary key (PK) value is a unique identifier assigned by the system, where a given list has a unique code. The system may use the primary key value to import standard comments from a file, such as an XLS spreadsheet file, and to link the incoming comments to matching List records. A user may assign a label to the list that describes the list. The system may display the label on reports, such as on correction list reports. A value, which may be a descriptive short name (e.g., an abbreviated version of the label) or a code, may be entered by the user. The value may be used by the system on controls, graphs, timelines and reports.

In the example illustrated in FIG. 19, based on the order numbers, the 'Residential Initial/RE INIT' comments will be positioned at the top of the Correction list, followed by architectural comments, mechanical, etc. Optionally, the system allows comment records to be assigned the same order number and does not require sequential ordering of records.

The correction list reports may be grouped by the discipline, then by the category and then by a subcategory, using the order number and then the label value. Where two or more records have the same order number, in certain embodiments, the records having the same order number may be sorted by the system alphabetically or using other criteria. The foregoing features enable different agencies/ entities flexibility in defining how to group list records.

By way of illustration, in the example illustrated in FIG. 20, for the list type "Category", the user has created a numbering scheme within the Label and Value columns and set the ordering for each record. Similarly, in the example illustrated in FIG. 21, for the list type "Subcategory", the user has created an alphabetical ordering scheme within the Label and Value columns and set the ordering for each record.

Once comments (e.g., standard comments) have been uploaded or manually entered into the database, an administrator can check the information to see how it will 'sort' on the correction list report. This validation can be run on all standard comments, or on a filtered set of comments. A user can activate a sort control and the system uses the PK values in the comment record to locate corresponding order values in the list tables and to sort the results accordingly. The user can change the sort as desired. For example, the user can modify the order values in the discipline, category and sub-category records from the list management user interface, and the system will resort the comments accordingly.

As noted above, one or more documents may be associated with a building plan or the documents may be otherwise associated with a project (including a completed project). In some cases, a document may be a recordation of an event associated with a project. A document may be associated with a comment regarding the project (e.g., the comment may link to the document or may include the document). An event may be, by way of example, a construction issue that needs remediation or correction (e.g., a too small or improper support structure, a defective bolt, a missing door, a missing exit sign, an insufficient amount of concrete, improper wiring, missing or improper insulation, etc.), or an inspection of a remediation task (e.g., an inspection of a bolt installed to replace a defective bolt), or an inspection not connected to a remediation task (e.g., a periodic inspection of bridge cables or an inspection of a construction project to document compliance with building codes, an inspection for the purposes of granting a certification, an inspection for insurance purposes, etc.).

By way of example, an event document may document a site, a structure, or a part that may need repair, maintenance, or inspection or that has been repaired, had maintenance performed, or has been inspected. Examples of a document include a still photo image, a frame from a video recording (e.g., of the site or of a structure or part that may need repair or maintenance, an inspection of a remediation, or a periodic inspection), a video file (e.g., multiple frames of the site or of a structure or part that may need repair or maintenance, an inspection of a remediation, or a periodic inspection), an audio file (e.g., of an inspector commenting on issues that the inspector identifies or finds absent during a site inspection), a drawing (e.g., of the site or of a structure or part that may need repair or maintenance), or any combination of the foregoing. One or more document players/viewers may be provided to display or play the document (e.g., a video player, an audio player, an image viewer, a player that can display/play multiple types of media, etc.). Controls, such as pause, play, rewind, fast rewind, forward, fast forward, etc., may be provided enabling the user to control player playback of video, image, or audio content.

An item of content may optionally be associated with location information indicating geographically where different portions of the content were recorded. For example, as a user walks around a structure recording content (e.g., video, still image, audio content, or text content) using a recorder, the recorder may access and store GPS or other locator information (e.g., latitude, longitude, and/or elevation information) in association with a corresponding portion of the content. Thus, for example, if an inspector is inspecting a bridge, as the inspector walks along the bridge recording video, the recorder may obtain (e.g., via a GPS receiver) and record the latitude, longitude, and/or elevation information that each video frame was recorded at. Such location information may be displayed and optionally continuously updated when the player plays back the content.

A given document may be automatically or manually associated with a given task, project, or comment, and may be included in a correction list as similarly discussed above. The plan management system may record in a data store (e.g., in the example data layer illustrated in FIG. 1 and discussed above) an association of a document with one or more tasks, projects, and/or comments. Optionally, a user interface is provided by the system via which a user may associate metadata with a given document or a specific portion of a document (e.g., a single frame or a selected set of frames from a video document or a portion of a still image or an audio file). For example, the metadata may include a task type (e.g., defect identification, inspection of remediation, scheduled inspection, etc.), criticality of the task (e.g., urgent, major, minor, informational, etc.), construction specific descriptors, such as a part number of a part depicted in the document, a code (e.g., a standardized code) indicative of the issue identified with respect to the part (e.g., code XX for "bolt missing"), a free form text comment (e.g., "the bolt appears to have backed out and is missing"), a replacement part number, labor costs and/or time for correcting the issue (which may be expressed using a standardized code), parts cost for correcting the issue, labor requirements (e.g., the specialty/certification of the person needed to correct the issue), dependencies, etc. As noted above, optionally standardized codes may be used for such items as labor costs, labor requirements, etc.

Optionally, as similarly discussed above, drawing or other annotation tools may be provided that enable a user to add graphical and/or textual annotations to a document or a portion thereof (e.g., to a single frame or a selected set of frames from a video document, a still image, an audio recording or a portion thereof, etc.). For example, an annotation toolbox may be provided via a toolbar or tool pane, or otherwise. The toolbox may include a variety of annotation shapes and drawing tools, such a polygon, a rectangle, an oval, a circle, a triangle, a parallelogram, a trapezoid, a line, freehand drawing, an arrow, etc. Such shapes may be used to surround or point to an item of interest (e.g., a part or area that needs remediation, or that has been inspected). Tools may be provided to change the color, perimeter/line width (sometimes referred to as line weight), the perimeter/line type (e.g., solid, dashed, dotted, etc.), fill color and transparency, and/or other shape properties.

Optionally, the system enables the user to select an annotation shape from the toolbox, identify a starting point for the annotation shape by clicking on a point in the document (or otherwise), which will instantiate a beginning point of the shape, and then use a pointing device to drag or otherwise specify the shape size and/or orientation. By way of further example, if the polygon shape is selected, the system enables the user to define the polygon by clicking at various locations around the object of interest to define the vertices of the polygon. By way of yet further example, the system may enable a user to add an arrow pointing to an area of interest in a document. Other techniques may be used to enable the user to add annotation shapes and to define their size and orientation. For example, user editable fields may be provided via which a user can define an annotation shape size and/or orientation.

Optionally, different annotation toolboxes may be accessed and presented for different types of documents. For example, there may be one annotation toolbox for video media, and another annotation toolbox for audio media, although there may be overlapping features. For example, the annotation toolbox for audio media may include a text annotation tool, and have fewer, different or no geometrical annotation shapes as compared to the toolbox for video media. Thus, the system may detect the type of media being accessed and select and present the association annotation toolbox.

As noted above, optionally the user interface enables the user to define shape perimeter/line thickness, color, blinking, type (e.g., solid, dashed, dotted, etc.), or other form of emphasis and/or other property. Optionally, a given shape and/or emphasis (e.g., a shape perimeter property) may be associated with metadata that specifies an annotation type, event, and/or criticality. For example, a red perimeter may be used to indicate a critical issue (e.g., a safety defect), an orange perimeter may be used to indicate a "major" issue, a blue perimeter may be used to indicate a "minor" issue, and a green perimeter may be used associated with an informational notice that does not necessitate any action be taken. Other colors and indicators may be used. For example, a circle may be used to indicate a critical issue, a rectangle may be used to indicate a major issue, a triangle may be used to indicate a minor issue, and an arrow may be used to indicate an informational notice.

By way of further example, a thick, heavily weighted, shape perimeter/line may be used to indicate a critical issue, a medium shape perimeter may be used to indicate a major issue, a relatively narrow perimeter may be used to indicate a minor issue, and a thin shape perimeter may be used to indicate an informational notice. By way of yet further example, a solid shape perimeter may be used to indicate a critical issue, a shape perimeter composed of long, but broken segments (e.g., large dashes) may be used to indicate a major issue, a shape perimeter of relatively smaller segments (e.g., smaller dashes) may be used to indicate a minor issue, and a shape perimeter composed of dots may be used to indicate an informational notice. Various combinations of shape properties may also be used to communicate criticality or other information.

By way of further example, a shape property (e.g., perimeter property) may be assigned and used to indicate a specific type of event. The type of event a given shape property is assigned to may optionally change based on the project or asset to which the document corresponds (e.g., a determined by a user instructions, such as a user selection of an asset type menu item). For example, for a bridge, a red square shape may be used to indicate a structural failure, where an inspection is required. A right orange parallelogram shape may be used to indicate that moisture or condensation was detected. A blue right triangle shape may be used to indicate that cracks were detected. A purple trapezoid shape may be used to indicate screws are missing. If the project/asset were a pool, optionally some of the shapes may be used to signify different issues (e.g., pool specific issues), such as deck heaving, pipe leaks, pump failures, etc.

Optionally different annotation tools (e.g., shapes) may be associated with different asset types.

Optionally, a menu may be provided that includes predefined events that the user may select from and associate with an annotation (e.g., a shape) added to a document. Optionally, the user interface includes a field via which the user can manually add text to an event added to an annotation. Optionally, a voice record control may be provided, which when activated, causes the system to record a voice annotation (e.g., recorded via a user terminal microphone) in association with a given graphical and/or textual annotation, or in association with a document or portion thereof, even in the absence of a textual or graphical annotation. The system can then later access and playback the voice annotation in response to a user instruction.

Optionally, when a user adds such a graphical shape or shape property with respect to an item in a document, the system automatically stores corresponding searchable metadata (e.g., indicating criticality or event type) in association with the document and optionally displays the graphical shape (with the shape property modifications) in conjunction with the document. For example, if the user adds a shape with a red perimeter, the system may store criticality metadata (e.g., the phrase "critical" or a corresponding code, such as a number beginning with a certain prefix or a prefix letter code), in association with the document and/or the portion of the document (e.g., a video frame) to which the shape with the red perimeter was added to. Optionally, the system automatically generates and adds a unique identifier (e.g., unique with respect to like identifiers associated with the document or the project) for each annotation. Optionally, the unique identifier may include a code that indicates the event type. For example, the system may generate and assign a code beginning with "20" to indicate a critical event, a code beginning with "10" to indicate a major event, a code beginning with "5" to indicate a minor event, and a code beginning with 1 to indicate an informational event. Other codes may be used.

The system may also generate a time ribbon/scrubber bar for a document, such as a video document or an audio document, that indicates, via a symbol, color, or other indicator the presence of annotations and their time location within the document. The scrubber includes a control that the user may manipulate (e.g., drag with a pointing device) to move forward or backward in a video or to jump to a specific point in time. The scrubber may also indicate the video playback progress. The scrubber may include a scrubber bar and a scrubber control where the user can drag the controller within the bar to indicate a playback point. In response to the user selecting an annotation indicator in the time ribbon/scrubber, the player will jump to the corresponding point in the document (e.g., an annotated video frame in a video document or the beginning of a relevant portion in an audio document). If the document is a video document, the player will jump to the corresponding frame, but optionally will not begin playing the video until the user activates a play control. If the document is an audio recording (without a video component), the player will jump to the corresponding point in the audio recording, but optionally will not begin playing the audio recording until the user activates a play control.

Optionally, when a user plays back a document, associated recorded location information (e.g., latitude, longitude, and/or elevation information) is accessed and dynamically displayed and updated as the content is played backed. For example, if the user is playing back an audio recording of an inspector walking around a structure, the location of the inspector as he is speaking may be accessed and displayed. Optionally, the system may retrieve and display a map (e.g., via a map data store) or plan (e.g., via the data store layer illustrated in FIG. 1) of the location, and visually indicate in the plan or map where the current frame, image or audio content was recorded (e.g., via an arrow, dot, line, or other indicator).

If the document is an audio recording, the time ribbon/scrubber bar may also display amplitude or other audio recording-related information (e.g., geographical location information). The toolbox may be used to add graphical and/or textual annotations (e.g., tags) to one or more points of the audio recording as similarly discussed above. Optionally, to provide an easier to use interface, a control may be provided which when activated will automatically cause a default annotation (e.g., a vertical redline or other visual annotation) to be added to the time ribbon/scrubber bar to indicate the presence of significant audio content. Thus, while a user is listening to the audio recording, the user can activate the control when there is audio content of interest, and the system will add the default annotation. Optionally, the user interface enables the user to drag the annotation, via the ribbon/scrubber bar, from one point in the audio recording to another point. Optionally, the user may specify which default annotation is to be used.

A search engine, such as the plan management system search engine discussed above, may be configured to receive a user query, identify matching metadata, and identify the corresponding documents and/or portions thereof (e.g., a one or more selected frames of a video recording, a portion of a still image, a snipped of any audio recording, etc.). The user query may specify one or more projects (e.g., building projects), tasks (e.g., building project related tasks), events, keywords, codes, location information (e.g., latitude, longitude, and/or elevation), and/or document types. The search engine may return and present the search results organized by file, project, date, and/or date order, or otherwise. An ordering control may be provided via which the user can specify the ordering of the search results (e.g., list most recent documents first, organize so that video results are presented at the top of the search results, then still images, then audio files, etc.). A filter control may be provided enabling the user to filter the search results to obtain more refined search results (e.g., only show documents added between a specified data range, only show documents associated with a specified project identifier, only show documents of a particular media type, only show documents with associated a certain criticality annotation (or range of criticality annotations), etc.).

The system may automatically establish or identify (explicitly or as a result of a search) associations of different documents based on a common task type (e.g., inspection, remediation), common assets (e.g. a common building structure even if the actual projects are different), common geographical location, common time period, common human resources involved in creating and/or annotating the different documents (e.g., the same inspector), common recorders or recorder types used in recording the documents (e.g., a dedicated video recorder, a phone equipped with a recorder, etc.), common annotations, common users that have viewed the different documents, etc.

For example, it may be useful to associate two video recordings of the same structure taken several years apart to identify possible deterioration in an earlier project related to the structure. By way of further example, if a determination was made that a video recording had certain deficits, it may be helpful to identify other video recordings taken by the same inspector, using the same recorder, and/or using the same recorder type to determine if those recordings suffer from the same or similar deficits (e.g., insufficient lighting, incorrect angle, etc.). By way of yet further example, it may be helpful to associate different videos associated with different milestones of the same building project.

The search engine may be configured to enable the user to search for associated documents. For example, the search query may specify "show all related items based on the association of video 1 and video 2." By way of further example, the search query may specify "show all videos taken by John Doe." By way of yet further example, the search query may specify "show all videos taken using an ACME brand video recorder." By way of yet further example, the search query may specify "show all content annotated by the same person." By way of yet further example, the search query may specify "show all users that have viewed video 1 and 2." The search engine may process the search query, identify matches, and return corresponding search results for display to the user via a user terminal. Filter controls may be provided enabling the user to limit or expand the depth of associated relationships (e.g., by adding or deleting one or more of the associations discussed above).

Certain example user interfaces will now be described. The example user interfaces may be provided via the example presentation layer illustrated in FIG. 1 and discussed above, or otherwise.

Figure 22:
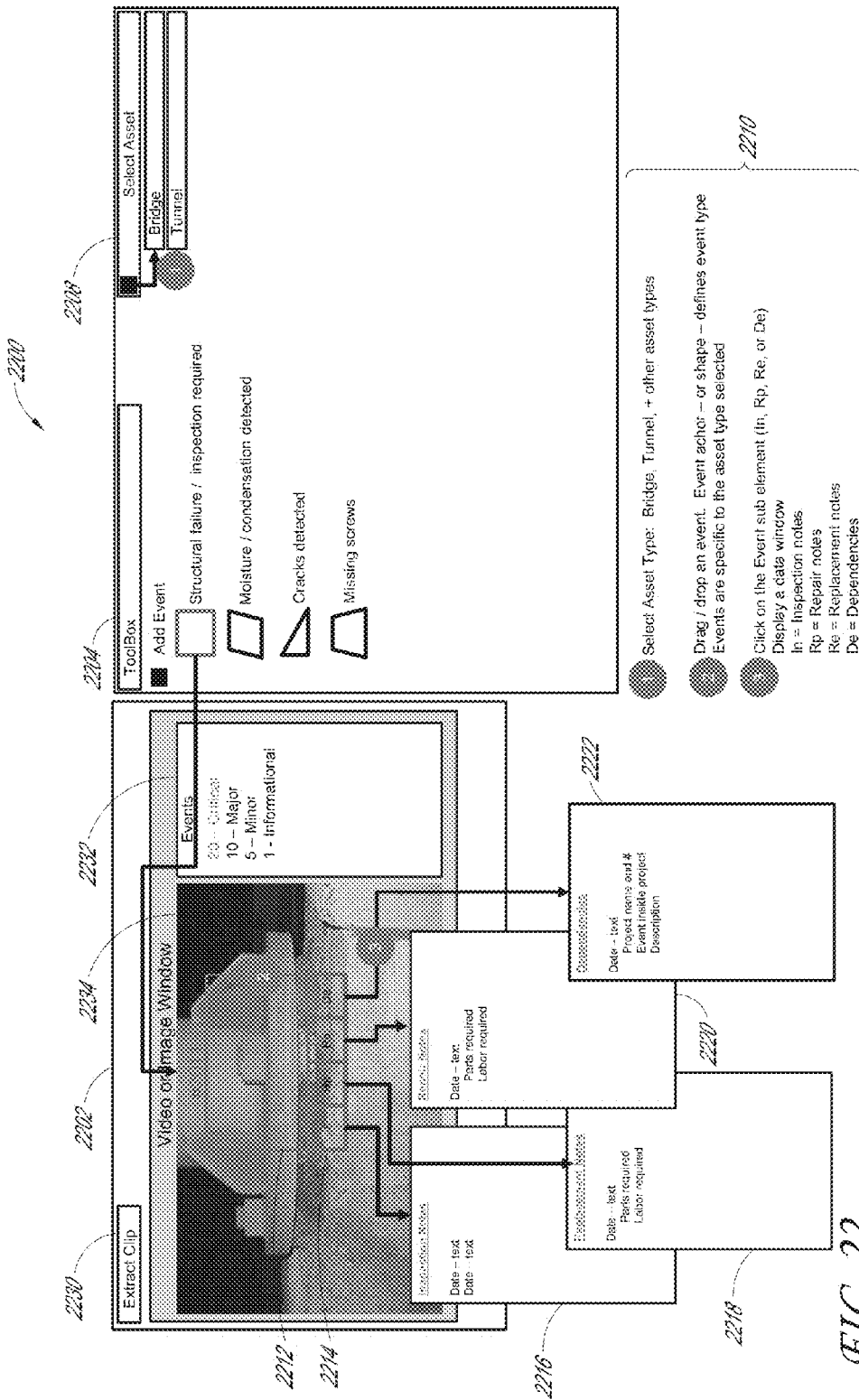

FIG. 22 illustrates an example document annotation user interface 2200 which enables a user to add graphical annotations, textual annotations, and/or audio annotations to a document, such as a video, still image, or audio document. In the illustrated example, a frame from a video file is being annotated, although a still image (e.g., a photograph) and other visual content may be similarly annotated. A viewing pane 2202 includes a video/image viewer/player 2234, an extract clip control 2230, and an events listing and a navigation interface 2232. The viewer/player 2234 displays a video frame of a video file in this example. The video file may have been accessed from a data store (e.g., the data layer database server illustrated in FIG. 1) and may have been loaded by a user. The viewer/player 2234 may act as an image viewer when a single image is being viewed or may act as a video player when a video file is being viewed.

The viewer/player 2234 may also be configured to play a slide show composed of multiple images, videos, audio recording, PDF files, word processing files, and/or other. Controls, such as pause, play, rewind, fast rewind, rewind a single frame, forward, fast forward, and/or advance forward a single frame, may be provided enabling the user to control player playback of video or audio content, and to select one or more frames to which annotations are to be added or to select or one or more audio clips. Once the user has selected one or more frames the user may activate the extract clip control 2230, and the system will extract the selected frames from the video. For example, in response to the extraction command, the system may copy the selected frame(s) and store the copied frames as a separate file, or the system may assign bookmarks to the beginning and ending frames to identify the selection of the frames, without storing the selected frames as a separate file. Similarly for an audio file without a video component, once the user has selected one or more audio clips, the user may activate the extract clip control 2230, and the system will extract the selected clips from the audio file. For example, in response to the extraction command, the system may copy the selected clips(s) and store the copied frames as a separate file, or the system may assign bookmarks to the beginning and ends of the clips to identify the selected clips, without storing the selected clips as a separate file.

A select asset control 2208 is provided which provides a menu of asset types, such as different types of structures that may be part of a project. In this example, a drop down menu is provided listing assets from which the user may select (e.g., bridge, tunnel, etc.). Optionally, the user interface may enable the user to specify a custom asset not included in the menu (e.g., a text field configured to receive an asset type name). Optionally, the annotation toolbox 2204 may be selected by the system based on the asset type specified by the user. For example, as similarly discussed above, different toolboxes for different asset types may include different shapes and/or different metadata (e.g., descriptions indicating an event type). In the illustrated example, the user has selected the bridge asset type and the system has selected and provided for display and user access a toolbox of the following example shapes to indicate different types of events: a red square shape to indicate a structural failure requiring inspection, a right parallelogram shape indicating the detection of moisture or condensation, a right triangle shape indicating the detection of cracks, and a trapezoid shape indicating missing screws.

The user may select a shape from the toolbox (or otherwise) that corresponds to the feature to be annotated, drag the selected shape using a pointing device (e.g., a mouse, trackpad, stylus, finger, etc.) to a desired anchor area in the displayed frame and use the pointing to size and/or orient the shape to surround or otherwise identify the feature of interest. The system may automatically store metadata in association with the clip or file indicating the positioning, size, orientation and/or other properties associated with the shape annotation (e.g., line width, line color, line type, color fill, etc.) without actually modifying the visual content of the original clip or frame with such shape annotation. Optionally, controls may be provided enabling the user to modify the properties of the shapes before and/or after the shapes are applied to the frame. For example, slider controls, menu selections and/or text entry fields may be provided via which the user can specify a shape's perimeter line width, line color, line type, color fill, color fill transparency, etc. Controls may also be provided enabling the user to specify properties associated with text notations, such as font, font size, font color, font underlining, font bolding, font italics, other font formatting, etc.

As noted above, an interface may be provided via which a plurality of video frames may be selected for annotation. By way of illustration, an interface may be provided via which the user can select a beginning frame and an end frame for a video frame sequence to which an annotation is to be added and/or via which the user can select individual frames to which an annotation is to be added.

For example, the user interface may play a video file via the viewer/player 2234 and provide a control enabling the user to indicate when the user wants to annotate a frame being displayed (e.g., when the user has seen an object in a frame that the user wants to annotate). Upon detecting that the user has activated the control, the player may display as a still image the frame that was being displayed when the user activated the control, and the user may add an annotation to the frame (e.g., by dragging and dropping a geometric shape over the object of interest as discussed elsewhere herein). A "switch view" control may be provided, which, in response to a user selection of the switch view control will cause the annotated frame and a plurality of frames prior to the annotated frame and a plurality of frames after the annotated frame in the video file to be displayed as still images (e.g., in an album view). The user can then select one or more frames by selecting individual frames (e.g., by clicking on individual frames with a pointing device), or by selecting a beginning frame and ending frame (e.g., by clicking on a first frame and a last frame with a pointing device), which will cause the beginning frame, the ending frame, and the frames between the beginning and ending frames to be selected. The system will then cause the annotation to added to/associated with (e.g., as metadata) the selected frames at the same or substantially the same location (e.g., an X-Y horizontal-vertical location) as in the originally annotated frame (e.g., so that a geometric shape annotation appears to surround the same object of interest). When the user then views a video clip comprising the selected frames, the annotation will be displayed in the selected frames, associated with (e.g., surrounding) the object of interest.

Optionally, rather than first annotating a frame and then selecting additional frames to which the annotation is to be added, the user may first select a plurality of frames, then annotate one of the selected frames, and the system will then cause the annotation to be associated with, and displayed in conjunction with the selected frames.

Optionally, the system may be configured with a video tracking engine, which enables a given object to be located in a plurality of frames (e.g., using object recognition). Thus, for example, if the user has identified and annotated an object of interest in a given frame, the system can then identify, using the video tracking engine, that object in nearby frames (which may have been selected by the user as discussed above) and add the annotation to the object in the nearby frames, even if the camera angle has changed somewhat or even if the object has moved to some degree. For example, the video tracking engine may employ kernel-based tracking, visual feature matching, blob tracking, contour tracking, and/or other tracking algorithms to track the object over multiple video frames.

Figure 23:
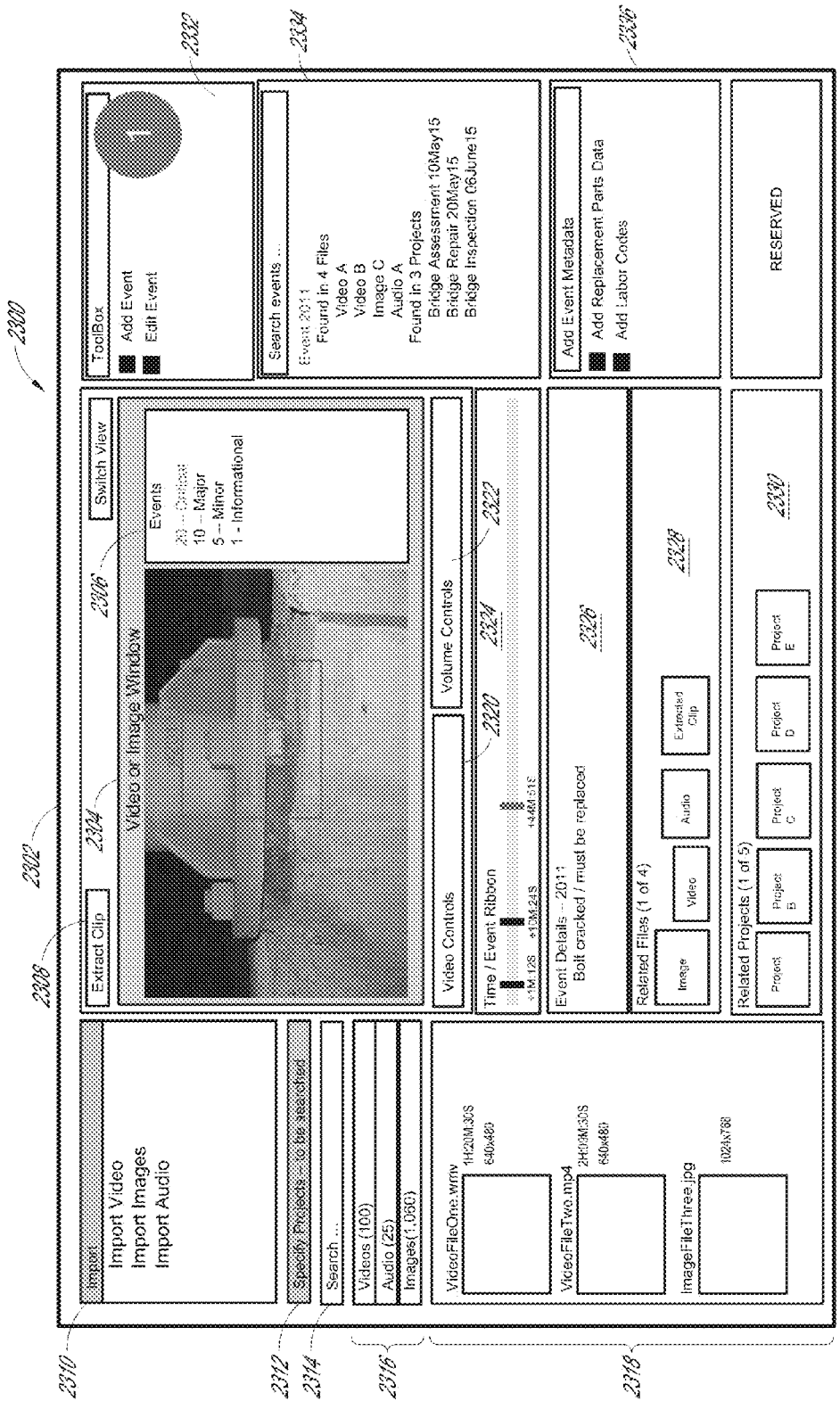

FIG. 23 illustrates an example document review user interface generated and/or provided by the system that enables a user to instruct the system to access and view documents, such as annotated documents, to extract one or more frames from a video, and to annotate images (e.g., a photograph or one or more frames from a video) with text and graphical notations. The example user interface also provides navigational controls, search interfaces, controls that enable the user to associate a document with other related documents or groups of related documents, and to navigate to annotations within a document.

In particular, the example document review user interface 2300 illustrated in FIG. 23 includes an import pane 2310 that enables the user to specify various type of documents to import, such as video documents (e.g., clips from video documents extracted using the user interface illustrated in FIG. 22), image documents (e.g., still photographs, PDF files, etc.), and audio documents. A search interface is provided enabling the user to search for documents, such as video, audio, or image documents, which may be annotated. The example search interface includes a project specification interface 2312 enabling the user to specify one or more projects to limit the search to. A search field 2314 is provided via which the user can specify one or more search query terms. A search control may be provided enabling the user to initiate the search using the search query terms and/or the project specification. In addition or instead, the search engine may perform an incremental/progressive search with each additional character the user enters into the search field 2314. Thus, the search engine may detect each character as it is being entered and identify in substantially real time matches based on the current query term characters. Such an incremental search technique will often enable the user to find desired matches without having to enter the entire phrase they want to search for.

A search summary 2316 is provided listing the number of each type of matching document (e.g., the number of video files, audio files, and image files). The user can select a given document type in the search summary 2316, and in response, the user interface will provide a listing 2318 of the corresponding documents (e.g., video, audio, or still image documents). For example, if the document type is video files, optionally the listing will include a first or other frame of the corresponding matching video files or will be play the videos while displayed in the search results, optionally with any sound track muted. In addition, associated metadata may be accessed and presented with the corresponding frame/video. For example, the metadata may optionally include some or all of the following information: the video file time length, format (e.g., width and height in terms of pixels), recordation date, recording equipment, edit date(s), author, last person that edited document, event type associated with document, location, and/or other metadata. Optionally, the listing 2318 will by default display a listing of a pre-specified document type. For example, the listing 2318 may by default list video documents associated with the specified project(s), but if the user selects audio documents from the search summary 2318, then the listing 2318 will list audio documents associated with the specified project(s). Optionally, a control may be provided enabling the user to specify a default document type to be listed.

If the user selects a given video from the listing 2318, it will be presented in a viewer window 2304 by a viewing module, such as a video player (where a window may be an area used to display information, such as a document). The video player may optionally be configured to play video content without an audio channel, video content and an associated audio channel, and/or an audio channel without a video channel. Optionally, the video player may also be configured to display still image files in one or more formats (e.g., GIF, PNG, JPEG, and TIFF, etc.) and/or play pure audio files (without a video component) in one or more formats (e.g., AAC, FLAC, MP3, WMA, WAV, PCM, etc.). The video player may be configured to play one or more of the following formats and/or other video formats: MPEG, DivX, H.264, MKV, WebM, VP8, WMV, etc. If the document is an image file, similar metadata may be presented (e.g., format (e.g., width and height in terms of pixels), recordation date, edit date(s), author, last person that edited document, event type associated with document, geographical location of recording, and/or other metadata), and if the user selects the image, the image will be displayed by an image viewer 2304 (which may be the video player discussed above or which may be a dedicated image viewer). If the document is an audio file (without an associated video component), the metadata may include encoding information, length, recordation date, edit date(s), author, last person that edited document, event type associated with document, geographical location of recording, and/or other metadata, and/or other metadata, and if the user selects the audio file, the audio file will be played by an audio file player (which may be the video player discussed above or which may be a dedicated audio player).

The example document review user interface 2300 may provide viewer controls corresponding to the document type selected by the user and presented by the corresponding viewer. Thus, for example, if the user selects a video file, the system may select and present video controls 2320 (e.g., pause, play, rewind, fast rewind, rewind a single frame, forward, fast forward, and/or advance forward a single frame) and volume controls 2322 (enabling the user to increase or decrease the volume of the audio track included in the video file). The viewer may correspondingly respond to activations of the controls by the user (e.g., rewind, play, pause, fast rewind, single frame rewind, forward, fast forward, single frame advance, etc.). If the document is a still image, optionally the controls selected and presented via the user interface 2300 will not include pause, play, rewind, fast rewind, rewind a single frame, forward, fast forward, and/or advance forward a single frame controls, but may include zoom in and/or zoom out controls and/or center image controls that enable the user to command the viewer to zoom in or out on the display or to center the image in the display. The viewer may also be configured to detect a user pointing to and clicking on different points in the viewer window 2304, enabling the user to drag the image (e.g., to control what portion of the image is displayed at the center of the viewer or within the viewer boundaries).

If the document is solely an audio file, the controls 2320 may include pause, play, rewind, fast rewind, rewind a set number of seconds (e.g., 1 second, 3 seconds or 5 seconds), forward, fast forward, and/or advance forward a set number of seconds (e.g., 1 second, 3 seconds or 5 seconds) controls.

The window 2304 is configured to display textual and/or graphical annotations in conjunction with a frame/image as may have been added using the interface illustrated in FIG. 22. The annotations may have been accessed from metadata stored in association with the displayed frame/image or may have been embedded in the image itself during the annotation process. In addition, a previously assigned unique event identifier may be displayed (e.g., #2011 in this example). An events listing interface 2306 may be provided. The events listing interface 2306 may list the various events and/or events types assigned to the displayed frame/image and/or may display a dictionary of event types and associated codes (e.g., a code beginning with "20" to indicate a critical event, a code beginning with "10" to indicate a major event, a code beginning with "5" to indicate a minor event, a code beginning with 1 to indicate an informational event, etc.).

An event ribbon 2324, which may include timing information, and/or a scrubber, is generated by the system and provided for display for the video file. The example event ribbon 2324 graphically indicates the relative time positioning of annotation events within the video and optionally provides a numerical time value indicating the time position of the events within the video (e.g., 1 minute and 12 seconds, 10 minutes and 24 seconds, 44 minutes and 51 seconds, etc.). Optionally, some or all of the event metadata is displayed in association with a corresponding event indicator.

The event indicators may comprise links corresponding to respective video frames to which the events have been added, wherein if a user clicks on or otherwise selects a given event indicator, the player will respond by accessing and displaying the corresponding video frame. Thus, for example, if the user clicks on the event indicator with the 10 minute 24 seconds time stamp, the player will display the frame located 10 minute 24 seconds into the video. Optionally, the video will be paused when the player jumps to the corresponding frame, and the user can then utilize the video controls 2320 to control the video playback. Optionally, instead, the player will begin playing the video at the beginning at the corresponding event frame without the user having to activate one of the video playback controls 2320.

An event details pane 2326 may be provided that lists annotation details (e.g., those entered via the interface illustrated in FIG. 22) associated with the frame displayed in the window 2304 and which may be associated with a graphical annotation associated with the frame. For example, the event details may include the unique annotation identifier discussed above. In the illustrated example, the event detail recites "bolt cracked/must be replaced". Optionally, the event detail may also include icons, image, and/or graphical information.

A related files pane 2328 lists files (e.g., image, video, audio, and/or extracted clip files) that are related to the currently presented/viewed file. The relation may have been defined by the user and/or the system may have automatically identified related files (e.g., based on common metadata, such as project identifier, event type, author, editor, etc.). At least partly in response to detecting a user selection of a related file, the system causes the file to be presented to the user via the interface 2300 (e.g., via the viewer 2304 or an audio player as appropriate). A related projects pane 2330 lists related projects, which may have been identified as related by a user or by the system based on the identification of common metadata.

A toolbox interface 2332 provides controls enabling the user to add an event to a document or to edit an event. The system may respond to a user activation of a toolbox control by presenting the example document annotation user interface 2200 illustrated in FIG. 22. A search events user interface 2334 enables a user to enter event search terms (e.g., keywords, event-type codes, document types, project identifiers, creation date, edit date, etc.). The search engine identifies matching events and generates a listing of files and/or projects that have matching events. In the illustrated example, the search engine has organized and presented the search results in an event grouping and a project grouping, and has provided a number indicating the quantity of matching events and a number indicating the quantity of matching projects. The listing provides event and project date information respectively, as well as the names of the event documents and the name of the project documents. An add event metadata interface 2336 provides controls that enable the user to add replacement parts metadata to an annotation and to add labor code metadata to an annotation.

Figure 24:
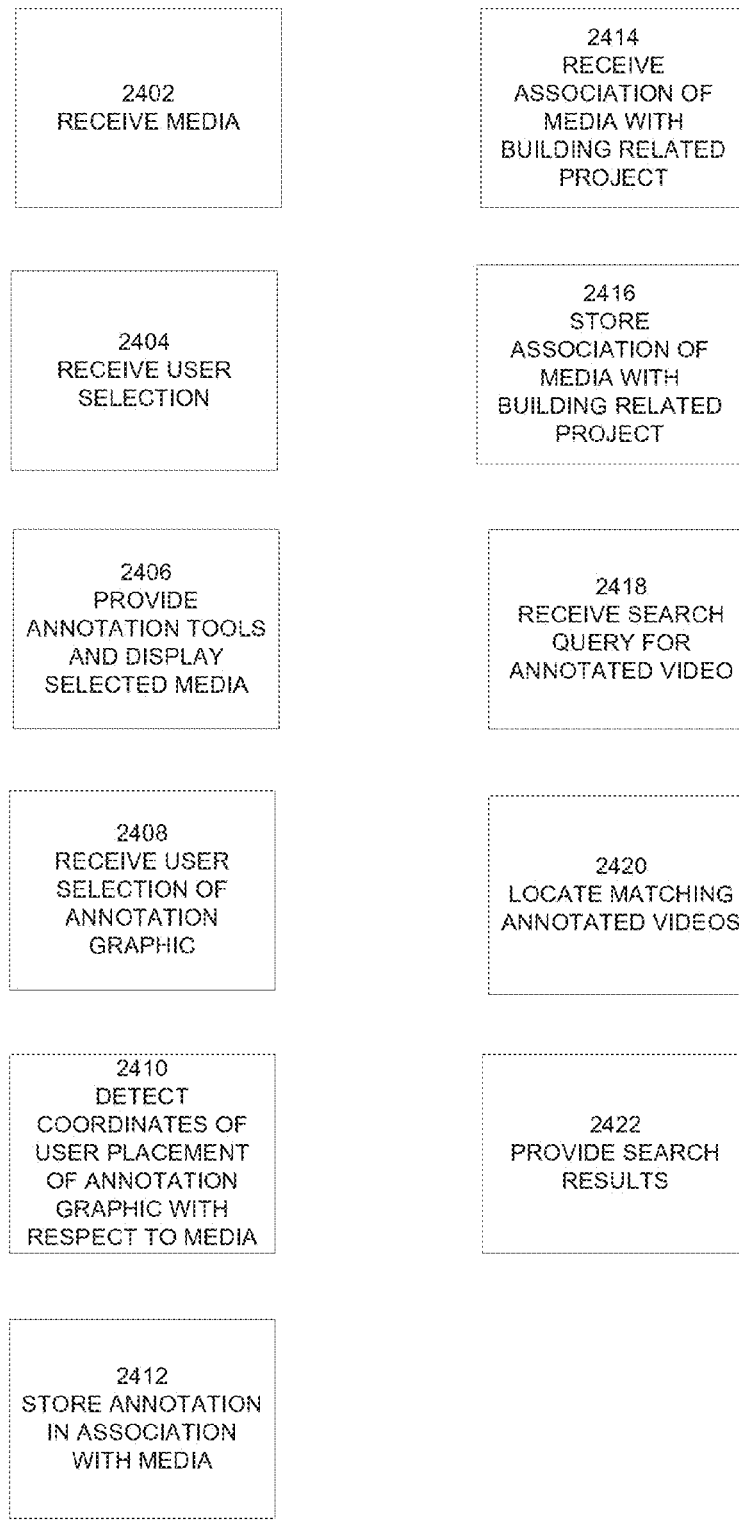
FIG. 24 illustrates an example process.

FIG. 24 illustrates an example building project-related media annotation process, which may be executed using the plan management system disclosed herein. The plan management system may include an annotation engine used to execute the process. At block 2402, one or more items of media to be annotated are received. The media may be building project-related media, such as a video file, a still image, and/or an audio file that relate to an aspect of a building related project. For example, the media may depict a structure or component that is defective or that has been inspected. At block 2404, a user interface is provided listing some or all received media. The listing may be filtered according to one or more criteria specified by the user, such as by building project identifier, by date of upload, by date of creation, by task type, by user which uploaded the media, by media type, by length, by project type, by geographical location (e.g., latitude, longitude, and/or elevation), and/or other criteria. A user selection of an item is received via the user interface.

At block 2406, a user interface comprising one or more media annotation tools are provided. The annotation tools may include graphic annotation tools, such as geometric shapes, free form drawing tools, text insertion tools, etc., which may be added to the media. The tools presented to the user may be dynamically selected based at least in part on the project type (e.g., a high rise building, a low rise building, a private home, a hospital, a school, a bridge, a tunnel, a water containment structure, etc.). Interfaces may be provided to enable the user to change one or more properties of an annotation, such as color, size, line thickness, line form, size, etc. The selected media, or a portion thereof, may be presented via a player/viewer in conjunction with the annotation tools. For example, if the selected media is a still image, the still image may be displayed by the player/viewer. By way of further example, if the selected media is a video file, the video file may be played or one or more frames may be displayed in still format. As discussed elsewhere herein, a user may select multiple frames of a video file to commonly annotate.

At block 2408, the process detects that the user has selected an annotation tool (e.g., an annotation graphic tool, such as a geometrical shape) and enables the user to drag and drop (or otherwise position) the annotation graphic on the presented media, and size and orient the graphic annotation (e.g. to surround or point to a feature of interest, such as a defective component or structure, or an inspected feature). At block 2410, the process detects the placement, size, and orientation of the graphic annotation placed on the media. The process may also detect any modification that the user has made to the annotation graphic, such as changes in perimeter color, perimeter thickness, or line type (e.g., dashes, dots, solid, etc.), or user added text notations. At block 2412, the process detects stores annotation information in association with the media (e.g., in a data store, such as the data layer illustrated in FIG. 1). For example, the process may store some or all of the following: an identification of which annotation graphic was used, the placement of the annotation graphic (e.g., X-Y frame coordinates of an anchor point, size, orientation, etc.), user modifications to the properties of the annotation graphic (e.g., changes in perimeter color, perimeter thickness, line type, etc.), text added to the annotation graphic by the user, default metadata associated with the annotation graphic (e.g., metadata indicating the criticality of the feature being highlighted by the annotation graphic), an identification of the frame(s) to which the annotation has been applied, an identification of the corresponding video file, etc. The stored annotation information may be configured to be searchable.

At block 2414, an association of the annotated media (and/or the entire media file of which the annotation media may form a part of) with a building-related project and/or a building project-related task is received via a user interface from the user. At block 2416, the association with a building-related project and/or a building project-related task is stored in association with the media.

At block 2418, a search query is received from a user via a search interface. The user query may specify one or more projects (e.g., building-related projects), tasks (e.g., building project related tasks), events, keywords, codes, annotations, and/or document types. At block 2420, a search engine locates matching media (e.g., annotated media) based at least in part on a determination as to which stored media the query terms match and optionally the degree of match. For example, the search engine may compare the user query against metadata or other information associated with the stored media to identify matching media. The search engine may return and present the search results organized by file name (e.g., alphabetically), project (e.g., by project name), date order, media type, and/or length. An ordering control may be provided via which the user can specify the ordering of the search results (e.g., list most recent documents first, organize so that video results are presented at the top of the search results, then still images, then audio files, etc.). A filter control may be provided enabling the user to filter the search results to obtain more refined search results (e.g., only show documents added between a specified data range, only show documents associated with a specified project identifier, only show documents of a particular media type, only show documents with associated a certain criticality annotation (or range of criticality annotations), etc.). The search results may be reordered and/or filtered in accordance with the user instructions and presented to the user.

Thus, as described herein, certain embodiments enable a user to add comments, such a plan check comments, to plan sheets, and to search, filter, and report on comments added to an electronic building related document. Further, certain embodiments enable a user to upload standard comments en masse. Yet further, certain embodiments enable that automatic generation of correction lists, including comments from multiple departments. In addition, certain embodiments enable the graphical and textual annotation of documents, such as video or still image files.

While certain embodiments have been described with reference to the management of building-design related documents for illustrative purposes, embodiments described herein can likewise be utilized for managing manufacturing documents, clothing design documents, or other types of design documents.

User interfaces described herein are optionally presented (and user instructions may be received) via a user computing device using a browser, other network resource viewer, or otherwise. For example, the user interfaces may be presented (and user instructions received) via an application (sometimes referred to as an "app"), such as an app configured specifically for building plan-related activities, installed on the user's mobile phone, laptop, pad, desktop, television, set top box, or other terminal. Various features described or illustrated as being present in different embodiments or user interfaces may be combined into the same embodiment or user interface. While the disclosure may reference to a user hovering over, pointing at, or clicking on a particular item, other techniques may be used to detect an item of user interest. For example, the user may touch the item via a touch screen, or otherwise indicate an interest.

While the foregoing discussion and figures may illustrate various types of menus, other types of menus may be used. For example, menus may be provided via a drop down menu, a tool bar, a pop up menu, interactive voice response system, or otherwise.

The systems and methods disclosed herein can be implemented in hardware, plan management system, firmware, or a combination thereof. Plan management system can include computer readable instructions stored in memory (e.g., non-transitory, tangible memory, such as solid state memory (e.g., ROM, EEPROM, FLASH, RAM), optical memory (e.g., a CD, DVD, Bluray disc, etc.), magnetic memory (e.g., a hard disc drive), etc., configured to implement the algorithms on a general purpose computer, special purpose processors, or combinations thereof. For example, one or more computing devices, such as a processor, may execute program instructions stored in computer readable memory to carry out processed disclosed herein. Hardware may include state machines, one or more general purpose computers, and/or one or more special purpose processors.

While certain embodiments may be illustrated or discussed as having certain example components, additional, fewer, or different components may be used. Further, with respect to the processes discussed herein, various states may be performed in a different order, not all states are required to be reached, and fewer, additional, or different states may be utilized.

While reference may be made to a webpage, other interfaces, such as may be provided via a phone application, a toolbar, an interactive television, or otherwise may be used. While reference may be made to a browser, other applications may be used to view and navigate objects (e.g., web pages or other documents). While reference may be used to "standard comments" for purposes of illustration, the systems and methods disclosed herein may be also used with respect to other types of comments, including customized, non-standard comments.

Conditional language, such as, among others, "can," "could," "might," or "may," unless specifically stated otherwise, or otherwise understood with the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features elements, and/or steps are included or are performed in any particular embodiment.

Any process descriptions, elements, or blocks in the flow diagrams described herein, and/or depicted in the attached figures, should be understood as potentially representing modules, segments, or portions of code which include one or more executable instructions for implementing specific logical functions or steps in the process. Implementations are included within the scope of the embodiments described herein which elements or functions which may be deleted, depending on the functionality involved, as would be understood by those skilled in the art.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein. Further, embodiments may include several novel features, no single one of which is solely responsible for the embodiment's desirable attributes or which is essential to practicing the systems, devices, methods, and techniques described herein. In addition, various features of different embodiments may be combined to form still further embodiments. For example, aspects found in different user interfaces may be combined to form still further user interface.

What is claimed is:

1. A system for managing building plan documents, comprising:
   one or more computing devices; and
   non-transitory computer readable memory storing program code that when executed by the one or more computing devices is configured to cause the system to perform operations comprising:
   receiving an electronic building plan document including a plurality of plan sheets;
   providing a first of the plurality of plan sheets for display;
   providing a user interface via which a user can select or enter a first comment associated with the first plan sheet;
   providing a user interface via which the user can associate metadata, including at least a project type or discipline, with the first comment;
   storing a first plurality of comments, including at least the first comment, in association with respective metadata;
   providing a user interface enabling a user to upload a video file, image file, audio file;
   providing an asset menu including a plurality of different physical structure types, including at least one of a high rise building, a low rise building, a private home, a hospital, a school, a bridge, a tunnel, or a water containment structure, via which the user can select a physical structure type;
   receiving a user selection of a physical structure type via the asset menu;
   selecting a toolbox of building project-related annotation tools, comprising a first plurality of different geometrical shapes configured to be selectively placed on video frames of structures corresponding to the selected physical structure type, wherein each geometrical shape in the first plurality of different geometrical shapes indicates a different physical structure defect type and is associated with respective metadata indicating the physical structure defect type, wherein the toolbox of building project-related annotation tools is selected based at least in part on the received user selection of the physical structure type;
   providing a user interface comprising:
       the toolbox of building project-related annotation tools selected based at least in part on the received user selection of the physical structure type;
       an interface enabling a user to select one or more video frames from an uploaded video file;
       an editing area configured to display at least one user selected frame and enabling the user to drag and drop a geometric shape that indicates a respective physical structure defect type over a portion of a frame displayed in the editing area and to size the geographic shape;
       a user interface configured to enable a user to associate a criticality level from a plurality of criticality levels, including at least a critical event level and an informational event level, with the geometric shape dropped over the over the portion of a frame displayed in the editing area;
       an association interface enabling the user to define a relationship between a video file, a building project, and a building-related task;
   receiving a user annotation of at least one video frame, the user annotation comprising a geometrical shape selected by the user from the toolbox and corresponding metadata indicating a criticality of a building project related defect;
   receiving an association of the video file with a first building project-related task comprising remediation or inspection;
   storing the user annotation of the at least one video frame, the user annotation comprising the geometrical shape selected by the user from the toolbox and corresponding metadata indicating the criticality of the building project related defect and physical structure defect type;

storing the association of the video file with the first building project and the first building project-related task;

providing a search limiter user interface enabling the user to identify a building project for which a search is to be limited to;

providing a search interface enabling the user to search for building project-related annotated video files;

receiving a first user search query via the search interface enabling the user to search for building project-related annotated video files;

identifying, based at least in part on a comparison of the first search query with video file metadata, at least one building project-related annotated video file; and providing search results comprising the at least one identified building project-related annotated video file, wherein the search results including the at least one identified building project-related annotated video file are limited to the building project identified via the search limiter user interface.

2. The system as defined in claim 1, the operations further comprising:
enabling the user to annotate an audio file; and
receiving an association of the audio file with at least one building project-related task.

3. The system as defined in claim 1, the operations further comprising:
identifying relations between two or more media files based at least in part on:
commonality of assets; or
commonality of human resources involved in creating the two or more media files; or
commonality of viewers, or
any combination of commonality of assets, commonality of human resources involved in creating the two or more media files, or commonality of viewers;
receiving a search query from the user requesting media files having one or more specified commonalities;
identifying two or more media files having the one or more specified commonalities;
providing search results indicating the identified two or more media files having the one or more specified commonalities.

4. The system as defined in claim 1, the operations further comprising:
providing a user interface configured to enable the user to select at least a first video frame from the video file;
receiving an annotation from the user for the first frame;
displaying, using a player, the first frame with the annotation;
accessing location information indicating where the first frame was recorded; and
indicating the location via a plan document or a map while the first frame is displayed.

5. The system as defined in claim 1, the operations further comprising:
providing a user interface configured to enable the user to select a plurality of video frames from the video file as a group;
receiving a geometric annotation from the user for a first frame in the group of selected video frames, wherein the geometric annotation is associated with a first X-Y location in the first frame in the group of selected video frames; and
associating the geometric annotation with each of the group of selected video frames;

playing, using a video player, the group of selected video frames, wherein the video player displays the geometric annotation at substantially the same X-Y position in each video frame in the group of selected video frames.

6. The system as defined in claim 1, wherein storing the user annotation of the at least one video frame comprises storing an identification of the geometrical shape selected by the user and a positing of the geometrical shape selected by the user within the at least one frame without modifying the visual content of the at least one frame.

7. The system as defined in claim 1, the operations further comprising tracking at least one annotated object through two or more frames utilizing one or more of kernel-based tracking, visual feature matching, blob tracking, or contour tracking.

8. The system as defined in claim 1, wherein the toolbox comprises a first geometric shape associated with metadata indicating an urgent issue, a second geometric shape associated with metadata indicating a major issue, and a third geometric shape associated with metadata indicating a minor issue.

9. The system as defined in claim 1, the operations further comprising providing a search filter control enabling the user to filter a search by building project related task.

10. The system as defined in claim 1, the operations further comprising enabling the user to include a link to the annotated video file in at least one plan sheet of at least one electronic building plan document.

11. The system as defined in claim 1, wherein the building-related task comprises an inspection task.

12. The system as defined in claim 1, wherein the building-related task comprises a remediation task.

13. The system as defined in claim 1, the operations further comprising providing a user interface configured to enable the user to associate an audio recording with at least one plan sheet of at least one electronic building plan document.

14. A system for managing building plan documents, comprising:
one or more computing devices; and
non-transitory computer readable memory storing program code that when executed by the one or more computing devices is configured to cause the system to perform operations comprising:
receiving an electronic building plan document including a plurality of plan sheets;
providing a user interface enabling a user to upload a video file;
providing an asset menu including a plurality of different physical structure types, including at least one of a high rise building, a low rise building, a private home, a hospital, a school, a bridge, a tunnel, or a water containment structure, via which the user can select a physical structure type;
receiving a user selection of a physical structure type via the asset menu;
selecting a toolbox of building project-related annotation tools, comprising a first plurality of different geometrical shapes configured to be selectively placed on video frames of structures corresponding to the selected physical structure type, wherein each geometrical shape in the first plurality of different geometrical shapes indicates a different physical structure defect type and is associated with respective metadata indicating the physical structure defect type, wherein the toolbox of building project-related annotation tools is selected based at least in part on the received user selection of the physical structure type;

providing a user interface comprising:
the toolbox of building project-related annotation tools selected based at least in part on the received user selection of the physical structure type;
an interface enabling a user to select one or more video frames from an uploaded video file;
an editing area configured to display at least one user selected frame and enabling the user to drag and drop a geometric shape that indicates a respective physical structure defect type over a portion of a frame displayed in the editing area and to size the geographic shape;
a user interface configured to enable a user to associate a criticality level from a plurality of criticality levels, including at least a critical event level and an informational event level, with the geometric shape dropped over the over the portion of a frame displayed in the editing area;
an association interface enabling the user to define a relationship between a video file and the building plan document;

receiving a user annotation of at least one video frame, the user annotation comprising a geometrical shape selected by the user from the toolbox and corresponding metadata indicating a criticality of a building project related defect;
receiving an association of the video file with a first building project-related task comprising remediation or inspection;
storing the user annotation of the at least one video frame, the user annotation comprising the geometrical shape selected by the user from the toolbox and corresponding metadata indicating the criticality of the building project related defect and physical structure defect type;
storing the association of the video file with the first building project and the first building project-related task;
providing a search limiter user interface enabling the user to identify a building project for which a search is to be limited to;
providing a search interface enabling the user to search for building project-related annotated video files;
receiving a project identification via the search limiter interface;
receiving a first user search query via the search interface enabling the user to search for building project-related annotated video files;
identifying, based at least in part on a comparison of the first search query with video file metadata, at least one building project-related annotated video file; and
providing search results comprising the at least one identified building project-related annotated video file, wherein the search results including the at least one identified building project-related annotated video file are limited to the project identified via the search limiter user interface.

15. The system as defined in claim 14, the operations further comprising:
enabling the user to annotate an audio file; and
receiving an association of the audio file with at least one building project-related task.

16. The system as defined in claim 14, the operations further comprising:
identifying relations between two or more media files based at least in part on:
commonality of assets;
commonality of human resources involved in creating the two or more media files; and/or
commonality of viewers
receiving a search query from the user requesting media files having one or more specified commonalities;
identifying two or more media files having the one or more specified commonalities;
providing search results indicating the identified two or more media files having the one or more specified commonalities.

17. The system as defined in claim 14, the operations further comprising:
providing a user interface configured to enable the user to select at least a first video frame from the video file;
receiving an annotation from the user for the first frame;
displaying, using a player, the first frame with the annotation;
accessing location information indicating where the first frame was recorded; and
indicating the location via a plan document or a map while the first frame is displayed.

18. The system as defined in claim 14, the operations further comprising:
providing a user interface configured to enable the user to select a plurality of video frames from the video file as a group;
receiving a geometric annotation from the user for a first frame in the group of selected video frames, wherein the geometric annotation is associated with a first X-Y location in the first frame in the group of selected video frames;
associating the geometric annotation with each of the group of selected video frames; and
playing, using a video player, the group of selected video frames, wherein the video player displays the geometric annotation at substantially the same X-Y position in each video frame in the group of selected video frames.

19. The system as defined in claim 14, wherein storing the user annotation of the at least one video frame comprises storing an identification of the geometrical shape selected by the user and a positing of the geometrical shape selected by the user within the at least one frame without modifying the visual content of the at least one frame.

20. The system as defined in claim 14, the operations further comprising tracking at least one annotated object through two or more frames utilizing one or more of kernel-based tracking, visual feature matching, blob tracking, or contour tracking.

21. The system as defined in claim 14, wherein the toolbox comprises a first geometric shape associated with metadata indicating an urgent issue, a second geometric shape associated with metadata indicating a major issue, and a third geometric shape associated with metadata indicating a minor issue.

22. The system as defined in claim 14, the operations further comprising providing search a search filter control enabling the user to filter a search by building project related task.

23. The system as defined in claim 14, the operations further comprising enabling the user to include a link to the annotated video file in at least one plan sheet of at least one electronic building plan document.

24. The system as defined in claim 14, wherein the building project-related task comprises an inspection task.

25. The system as defined in claim 14, wherein the building project-related task comprises a remediation task.

26. The system as defined in claim 14, the operations further comprising providing a user interface configured to enable the user to associate an audio recording with at least one plan sheet of at least one electronic building plan document.

27. Non-transitory computer readable memory storing program code that when executed by one or more computing devices is configured to cause the one or more computing devices to perform operations comprising:
- receiving an electronic building plan document including a plurality of plan sheets;
- providing a user interface enabling a user to upload a video file;
- providing an asset menu including a plurality of different physical structure types, including at least one of a high rise building, a low rise building, a private home, a hospital, a school, a bridge, a tunnel, or a water containment structure, via which the user can select a physical structure type;
- receiving a user selection of a physical structure type via the asset menu;
- selecting building project-related annotation tools, comprising a first plurality of different geometrical shapes configured to be selectively placed on video frames of structures corresponding to the selected physical structure type, wherein a given geometrical shape in the first plurality of different geometrical shapes indicates a respective physical structure defect type and is associated with respective metadata indicating the physical structure defect type, wherein the toolbox of building project-related annotation tools is selected based at least in part on the received user selection of the physical structure type;
- providing a user interface comprising:
  - the building project-related annotation tools selected based at least in part on the received user selection of the physical structure type;
  - an interface enabling a user to select one or more video frames from an uploaded video file;
  - an editing area configured to display at least one user selected frame and enabling the user to drag and drop a geometric shape that indicates a respective physical structure defect type over a portion of a frame displayed in the editing area and to size the geographic shape;
  - a user interface configured to enable a user to associate a criticality level, indicating how critical a respective defect is, from a plurality of criticality levels with the geometric shape dropped over the over the portion of a frame displayed in the editing area;
  - an association interface enabling the user to define a relationship between a video file and the building plan document;
- receiving a user annotation of at least one video frame, the user annotation comprising a geometrical shape selected by the user from the building project-related annotation tools and corresponding metadata indicating a criticality of a building project related defect;
- receiving an association of the video file with a first building project-related task comprising remediation or inspection;
- storing the user annotation of the at least one video frame, the user annotation comprising the geometrical shape selected by the user from the building project-related annotation tools and corresponding metadata indicating the criticality of the building project related defect and physical structure defect type;
- storing the association of the video file with the first building project and the first building project-related task;
- providing a search interface enabling the user to identify a building project for which a search is to be limited to and to search for building project-related annotated video files;
- receiving a first user search query via the search interface enabling the user to search for building project-related annotated video files;
- identifying, based at least in part on a comparison of the first search query with video file metadata, at least one building project-related annotated video file; and
- providing search results comprising the at least one identified building project-related annotated video file, wherein the search results including the at least one identified building project-related annotated video file are limited to the project identified via the search limiter user interface.

* * * * *

UNITED STATES PATENT AND TRADEMARK OFFICE
CERTIFICATE OF CORRECTION

PATENT NO. : 9,792,024 B2  
APPLICATION NO. : 14/828361  
DATED : October 17, 2017  
INVENTOR(S) : Michael M. Chegini Page 1 of 1

It is certified that error appears in the above-identified patent and that said Letters Patent is hereby corrected as shown below:

In the Claims

In Column 36 at Line 6, In Claim 1, change "comment;" to --comment:--.

In Column 36 at Line 49, In Claim 1, before "portion" delete "over the".

In Column 39 at Line 20, In Claim 14, before "portion" delete "over the".

In Column 40 at Line 59, In Claim 22, after "providing" delete "search".

In Column 42 at Line 7, In Claim 27, before "portion" delete "over the".

Signed and Sealed this  
Twentieth Day of February, 2018

Andrei Iancu  
*Director of the United States Patent and Trademark Office*